(12) United States Patent
Yamazaki et al.

(10) Patent No.: US 7,038,836 B2
(45) Date of Patent: May 2, 2006

(54) SELF-LIGHT EMITTING DEVICE AND METHOD OF MANUFACTURING THE SAME

(75) Inventors: Shunpei Yamazaki, Tokyo (JP); Noriko Shibata, Kanagawa (JP)

(73) Assignee: Semiconductor Energy Laboratory Co., Ltd., Kanagawa-Ken (JP)

(*) Notice: Subject to any disclaimer, the term of this patent is extended or adjusted under 35 U.S.C. 154(b) by 0 days.

(21) Appl. No.: 10/919,335

(22) Filed: Aug. 17, 2004

(65) Prior Publication Data

US 2005/0030612 A1    Feb. 10, 2005

Related U.S. Application Data

(63) Continuation of application No. 09/817,675, filed on Mar. 27, 2001, now Pat. No. 6,781,746.

(30) Foreign Application Priority Data

Mar. 27, 2000 (JP) .............................. 2000-087355

(51) Int. Cl.
*G02F 1/00* (2006.01)
*H05B 37/02* (2006.01)
*B32B 19/00* (2006.01)

(52) U.S. Cl. ............. 359/321; 315/155; 428/690
(58) Field of Classification Search ............... 359/321; 315/155; 313/504; 257/79, 100; 428/690, 428/917, 68, 76
See application file for complete search history.

(56) References Cited

U.S. PATENT DOCUMENTS

| | | | |
|---|---|---|---|
| 4,695,717 A | 9/1987 | Hirai et al. | 250/214 LA |
| 4,951,601 A | 8/1990 | Maydan et al. | 118/719 |
| 5,247,190 A | 9/1993 | Friend et al. | 257/40 |
| 5,399,502 A | 3/1995 | Friend et al. | 438/22 |
| 5,686,360 A | 11/1997 | Harvey, III et al. | 438/28 |
| 5,811,177 A | 9/1998 | Shi et al. | 428/209 |
| 5,811,326 A | 9/1998 | Yamamoto | |
| 6,049,167 A | 4/2000 | Onitsuka et al. | 313/512 |
| 6,087,196 A | 7/2000 | Sturm et al. | 438/29 |
| 6,132,280 A | 10/2000 | Tanabe et al. | 445/58 |
| 6,143,433 A * | 11/2000 | Murata et al. | 428/690 |
| 6,150,187 A | 11/2000 | Zyung et al. | 438/26 |
| 6,198,220 B1 | 3/2001 | Jones et al. | 313/512 |
| 6,228,228 B1 | 5/2001 | Singh et al. | 204/192.1 |

(Continued)

FOREIGN PATENT DOCUMENTS

DE    19603746    4/1997

(Continued)

OTHER PUBLICATIONS

U.S. Appl. No. 09/619,486, Pending, Yamazaki.

(Continued)

*Primary Examiner*—Timothy Thompson
(74) *Attorney, Agent, or Firm*—Fish & Richardson P.C.

(57) ABSTRACT

To provide a process of successively forming from an EL layer, a cathode, a barrier layer and a cover layer in the same multi-chamber. By using a same film deposition method to form the EL layer and the cover layer, as shown in FIG. 1A, the EL layer, the cathode, the barrier layer, and the cover layer can be formed in the same multi-chamber in succession. Thus, as shown in FIG. 1B, a sealed structure of an EL element can be formed.

24 Claims, 16 Drawing Sheets

U.S. PATENT DOCUMENTS

| | | | |
|---|---|---|---|
| 6,268,695 B1 | 7/2001 | Affinito | 313/504 |
| 6,274,887 B1 | 8/2001 | Yamazaki et al. | 257/72 |
| 6,373,453 B1 | 4/2002 | Yudasaka | 345/76 |
| 6,413,645 B1 | 7/2002 | Graff et al. | 428/446 |
| 6,522,067 B1 * | 2/2003 | Graff et al. | 313/512 |
| 2003/0164497 A1 | 9/2003 | Carcia et al. | |
| 2003/0207488 A1 | 11/2003 | Carcia et al. | |
| 2004/0217348 A1 | 11/2004 | Carcia et al. | |

FOREIGN PATENT DOCUMENTS

| | | |
|---|---|---|
| EP | 0 880 303 A1 | 11/1998 |
| EP | 0 892 028 A2 | 1/1999 |
| EP | 0 999 595 A2 | 5/2000 |
| JP | 10-12377 | 1/1998 |
| JP | 10-092576 | 4/1998 |
| JP | 10-153967 | 6/1998 |
| JP | 10-254383 | 9/1998 |
| JP | 11-54270 | 2/1999 |
| WO | WO90/13148 | 11/1990 |
| WO | WO 00/65670 | 11/2000 |

OTHER PUBLICATIONS

Herman Schenk et al., "Polymers for Light Emitting Diodes", EuroDisplay '99 Proceedings, pp. 33-37; Sep. 6-9, 1999.

M. A. Baldo et al., "Highly Efficient Phosphorescent Emission from Organic Electroluminescent Devices", Nature vol. 395, Sep. 10, 1998, pp. 151-154.

M. A. Baldo et al., "Very High-Efficiency Green Organic Light-Emitting Devices Based on Electrophosphorescence", Applied Physics Letters vol. 75, No. 1, Jul. 5, 1999, pp. 4-6.

Tsutsui et al., "Electroluminescence in Organic Thin Films", Photochemical Processes in Organized Molecular Systems, 1991, pp. 437-450.

Tsutsui et al., "High Quantum Efficiency in Organic Light-Emitting Devices with Irdium-Comolex as a Triplet Emissive Center", Japanese Journal of Applied Physics vol. 38, Part 12B, Dec. 15, 1999, pp. L1502-L1504.

International Search Report (Application No. 01107616.3), Aug. 30, 2005, 3 pages.

* cited by examiner

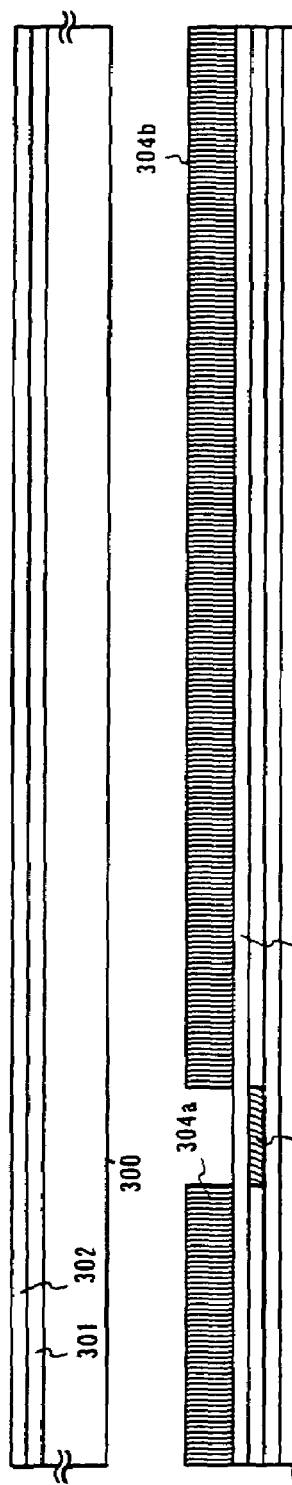

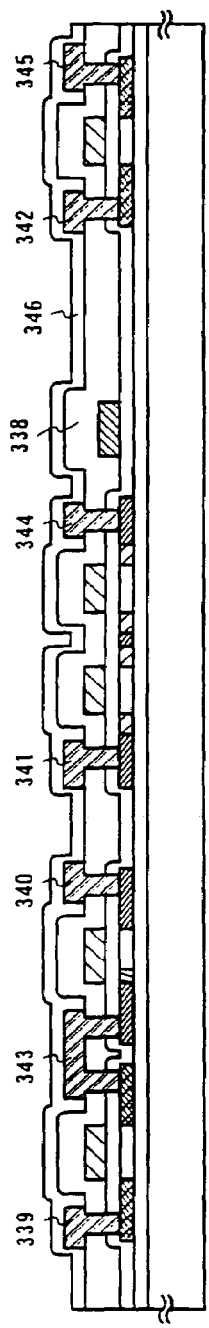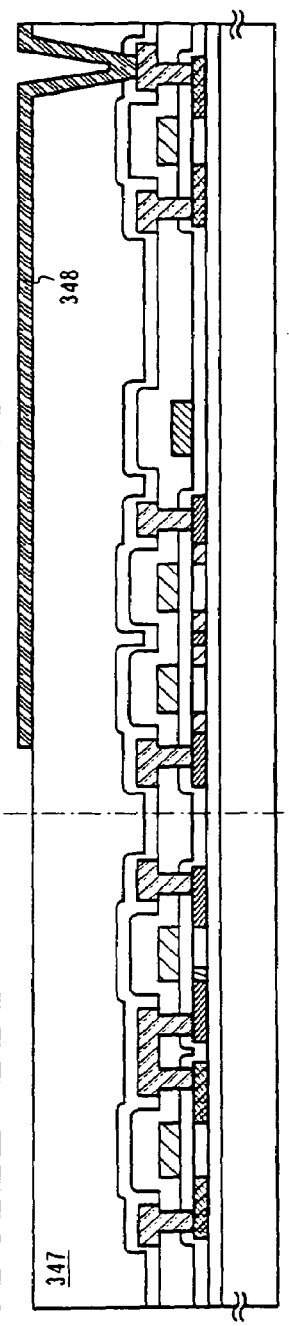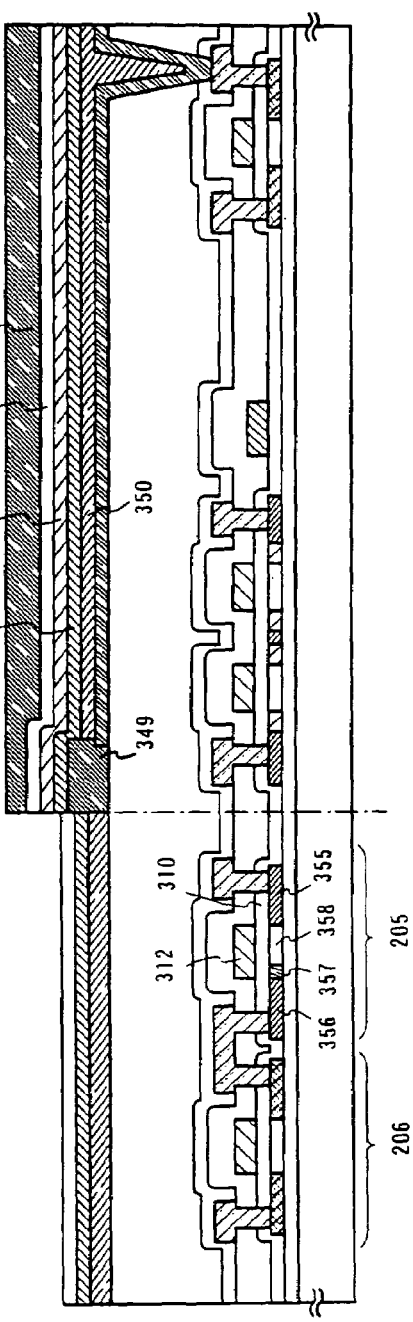
Fig.6A
Fig.6B
Fig.6C

SELF-LIGHT EMITTING DEVICE AND METHOD OF MANUFACTURING THE SAME

CROSS-REFERENCE TO RELATED APPLICATIONS

This application is a continuation application of U.S. application Ser. No. 09/817,675, filed Mar. 27, 2001 now U.S. Pat. No. 6,781,746, now allowed, which claims the benefit of a foreign priority application filed in Japan as Serial No. 2000-087355 on Mar. 27, 2000. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a self-light emitting device that has an EL element formed over an insulating member and constructed of a luminous organic material (hereinafter referred to as organic EL material) capable of obtaining EL (Electro Luminescence) sandwiched between an anode and a cathode, and to a method of manufacturing an electric appliance having the self-light emitting device as a display unit (a display or a display monitor). It is to be noted that the above-mentioned self-light emitting device is also referred to as an OLED (Organic Light Emitting Diodes).

2. Description of the Related Art

In recent years, the development of a display device (self-light emitting device) using as an EL element a self-light emitting element that utilizes the EL phenomenon of a luminous organic material is proceeding. The self-light emitting device is a self-emissive type device and, hence, unlike a liquid crystal display device, does not need a back light. In addition, the self-light emitting device has a wide angle of view, and therefore is perceived as a prospective display unit for electric appliances.

Note that the EL element is composed of a layer containing an organic compound from which electro luminescence (luminescence generated by applying an electric field) can be obtained (hereinafter referred to as EL layer), an anode layer, and a cathode layer. There are two types of luminescence in an organic compound, one being a luminescence that is generated in returning to a ground state from a singlet excitation state (fluorescence) and the other being a luminescence that is generated in returning to a ground state from a triplet excitation state (phosphorescence). The present invention may be applied to either type of luminescence.

There are two kinds of self-light emitting device: a passive type (simple matrix type) and an active type (active matrix type), and both types are being developed actively. In particular, the active matrix type self-light emitting device is currently attracting much attention. In the EL materials for the EL layer which can be said as the core of the EL element, researches are being made on low molecular based organic EL materials and high molecular based organic EL materials (polymer based). The polymer type organic EL materials are particularly highly regarded since they are easier to handle and have higher heat resistance in comparison with the low molecular based organic EL materials.

A method in which an application is controlled by an electric field and an ink-jet method proposed by Seiko-Epson, Co. can be cited as film deposition methods for the polymer type organic EL materials.

According to the present invention, the same method is used to form the EL layer and a film made of an organic material (organic resin) (the film will hereinafter be referred as a cover layer) that is formed over the EL element and covering the EL element. It is to be noted that the cover layer is a layer made of an organic material and which will be formed over the cathode of the EL element composed of an anode, an EL layer, and a cathode. The provision of this cover layer is effective for the stress relaxation of the TFT or the EL element. Further, the permeation of moisture and oxygen into the EL layer can be prevented, whereby the degradation of the EL layer can be prevented. By further forming a film made of an inorganic material (hereinafter referred to as a barrier layer) on the cover layer, moisture and oxygen can be prevented from permeating into the cover layer or the EL layer.

SUMMARY OF THE INVENTION

It is to be noted that the present invention has an object to provide a process of successively forming an EL layer, a cathode, a barrier layer, and a cover layer in the same multi-chamber.

Further, another object of the present invention is to form the cover layer at a desirable position with good control. In addition, a further object of the present invention is to provide a self-light emitting device that employs such means and a method of manufacturing the same, and to provide an electric appliance having such a self-light emitting device as its display unit.

The multi-chamber employed for the purpose of attaining the above object is a film deposition device which has an application chamber for forming the EL layer and the cover layer made of an organic material by the ink jet method or the electric field application method, an evaporation chamber for forming the cathode by evaporation, and a sputtering chamber for forming the barrier layer made of silicon nitride or tantalum oxide.

It is to be noted that, in the present invention, in the case of forming the EL layer by application of a solution in which an EL material is dissolved in a solvent, then this solution is provided in a material chamber. The solution is referred as an application liquid throughout the present specification. When the application liquid becomes atomized and has an electric charge, then the application liquid is controlled by the electric field that is imparted by the electrodes, whereby the EL layer is formed over a substrate at the application position.

Further, for the cover layer, an organic resin liquid for forming an organic resin film is provided in the material chamber. The cover layer is formed by an application method that is similar to that for the formation of the EL layer.

Note that in the present invention the barrier layer may be formed after forming the cover layer on the cathode of the EL element, or the structure thereof may be one in which the cover layer is formed after forming the barrier layer on the cathode of the EL element.

BRIEF DESCRIPTION OF THE DRAWINGS

The above and other objects and features of the present invention will be more apparent from the following description taken in conjunction with the accompanying drawings:

FIGS. 4A to 4E are views showing a manufacturing process of a self-light emitting device:

FIGS. 6A to 6C are views showing a manufacturing process of a self-light emitting device;

DETAILED DESCRIPTION OF THE PREFERRED EMBODIMENTS

Figure 1A:
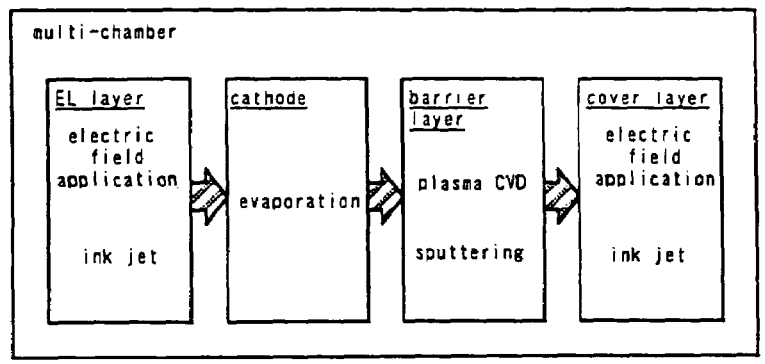
FIGS. 1A to 1C are diagrams showing a thin film formation method of the present invention.

An embodiment mode of the present invention will be explained here with reference to FIGS. 1A to 1C. As shown in FIG. 1A, an EL layer, a cathode, a barrier layer, and a cover layer can be successively formed in the same multi-chamber.

It is to be noted that the barrier layer is referred to as a passivation film provided for the purpose of preventing moisture and oxygen from penetrating into the EL layer and formed of an inorganic material.

First, the EL layer is formed in the application chamber by employing the electric field application method or the ink jet method. The cathode is formed next in the evaporation chamber by means of evaporation, and the barrier layer is further formed on the cathode. Using sputtering or plasma CVD, the barrier layer is formed of an inorganic film that is made of an inorganic material such as silicon nitride, tantalum oxide, aluminum nitride, or diamond-like carbon (DLC) made of carbon. Finally, on top of the barrier layer, the cover layer is formed in the application chamber by means of the ink jet method, similar to the formation of the EL layer, thereby completing the sealing structure of the self-light emitting device.

As thus explained, because the same method is used in forming the EL layer and the cover layer, the layers may be selectively formed only at the desired positions and may be processed in the same chamber.

Figure 1B:
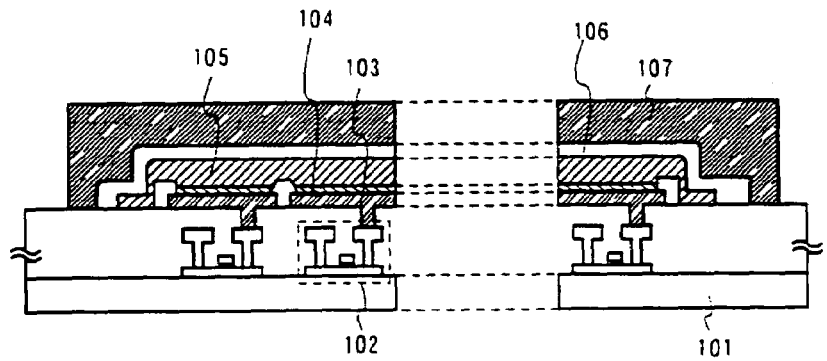

The sectional structure of a lamination film formed in the present invention is shown in FIG. 1B. In FIG. 1B, reference numeral 101 denotes a glass substrate and reference numeral 102 denotes a current control TFT. Furthermore, reference numeral 103 denotes a pixel electrode that is made of a transparent conductive film electrically connected to the current control TFT. An EL layer 104 is formed on the pixel electrode 103 by using the above-mentioned method, and a cathode 105 is further formed on the EL layer 104 by evaporation.

In addition, a barrier layer 106 made of an inorganic film such as silicon nitride, tantalum oxide, or DLC film made of carbon, is formed on the cathode 105. After the formation of the barrier layer 106, a cover layer 107 made of an organic resin film is formed thereon by using the application method that is the same as the EL layer.

Figure 1C:
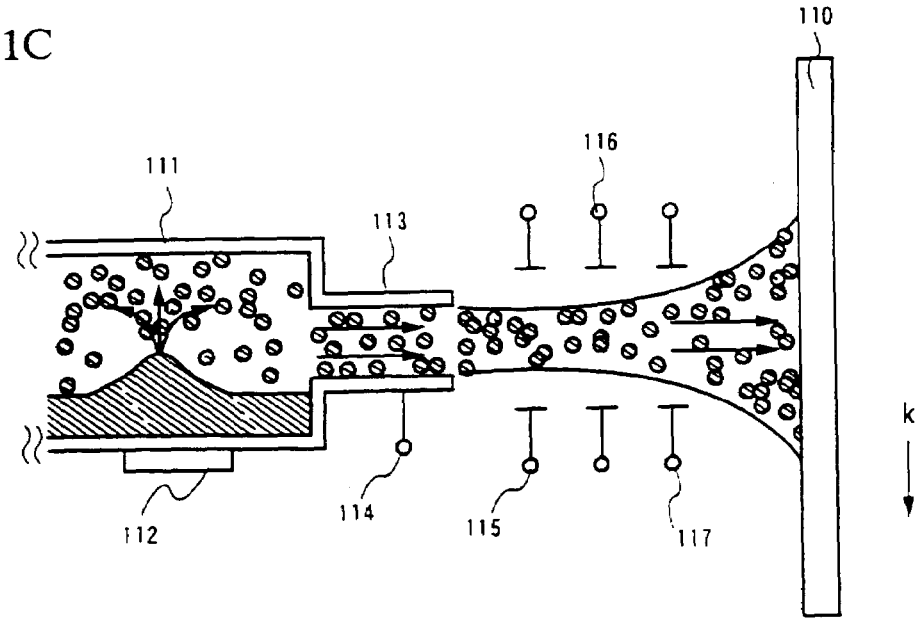

Shown in FIG. 1C is the electric field application method in which the application liquid is controlled by an electric field for application in the formation of the EL layer and the cover layer 107.

In FIG. 1C, reference numeral 110 denotes the substrate with the formation of up to the barrier layer in the lamination structure shown in FIG. 1B. Reference numeral 111 denotes a material chamber that is provided with an organic resin liquid for forming the cover layer. In the material chamber 111, an ultrasonic oscillator 112 is provided, and an electrode 114 is provided on a nozzle 113 at the tip of the material chamber 111, where the organic resin liquid is to be discharged.

In the case of the present invention, the organic resin liquid is atomized in the material chamber 111 through the impartation of ultrasonic oscillation to the ultrasonic oscillator 112. The organic resin liquid that has become atomized here is charged and turned into charged particles by the electrode 114 provided on the nozzle 113 of the material chamber 111, thereby forming the EL layer and the cover layer at desirable positions on the active matrix substrate 110.

A leading electrode 115 extracts the organic resin liquid that has become charged particles from the nozzle 113, an accelerating electrode 116 accelerates the charged particles in a flying direction. Further, a controlling electrode 117 controls the application position to thereby apply the liquid on the desired position of the substrate 110.

Thus, the sealing structure of the self-light emitting device in which the lamination structure shown in FIG. 1B can be formed in the same multi-chamber, is completed.

Note that FIG. 1B shows a case where the cover layer made of an organic material is formed after the formation of the barrier layer made of an inorganic material to cover the EL element. However, in the present invention, the barrier layer made of an inorganic material may be formed after the formation of the cover layer made of an organic material to cover the EL element.

Embodiment 1

Figure 2:
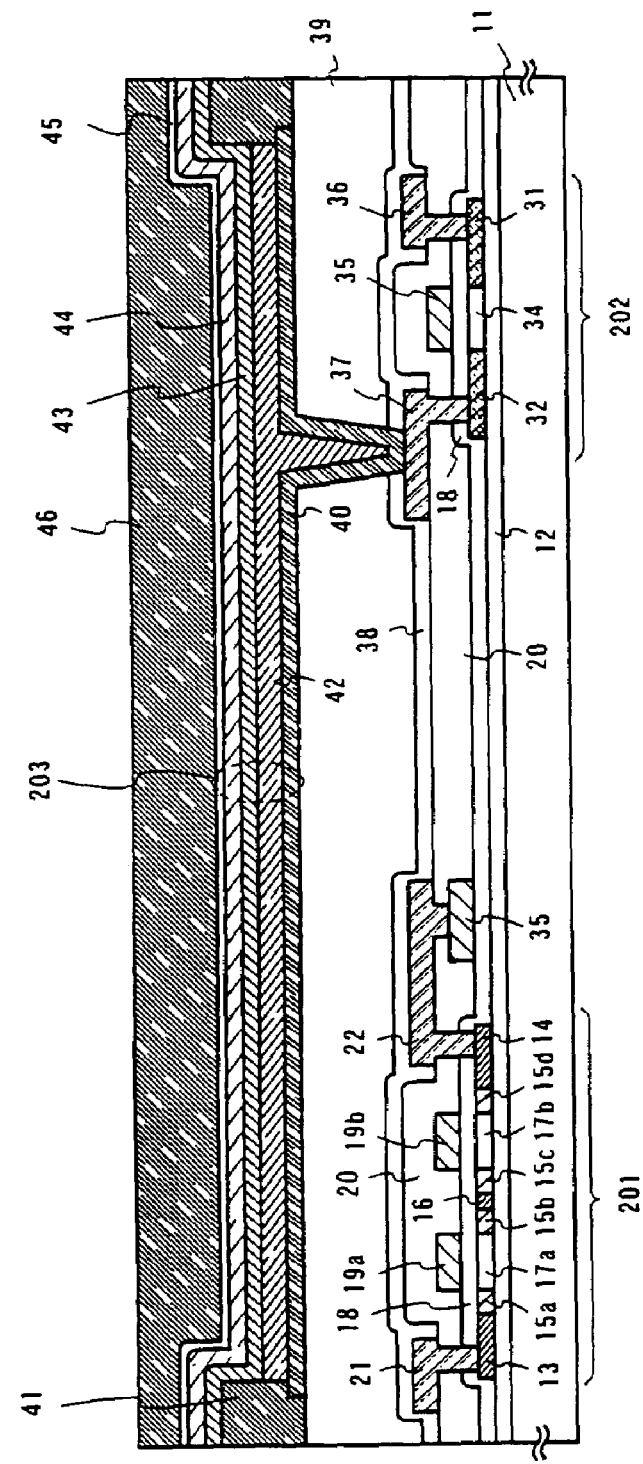
FIG. 2 is a diagram showing a cross-sectional structure of a pixel portion.
Figure 3A:
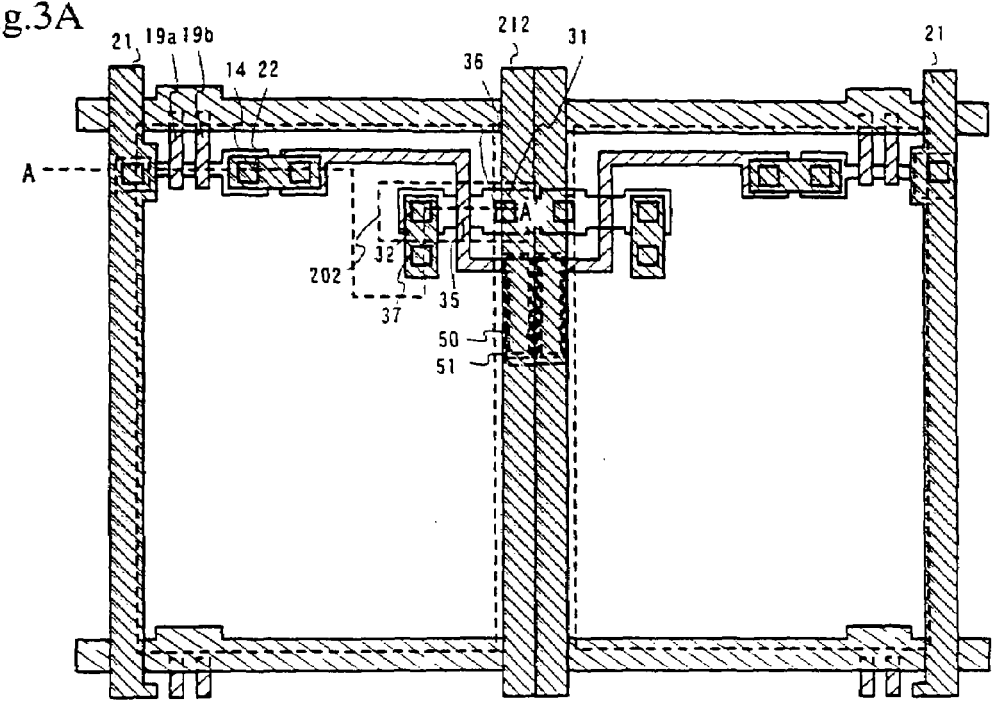
FIGS. 3A and 3B are diagrams showing a top view structure of a pixel portion and a configuration thereof, respectively.
Figure 3B:
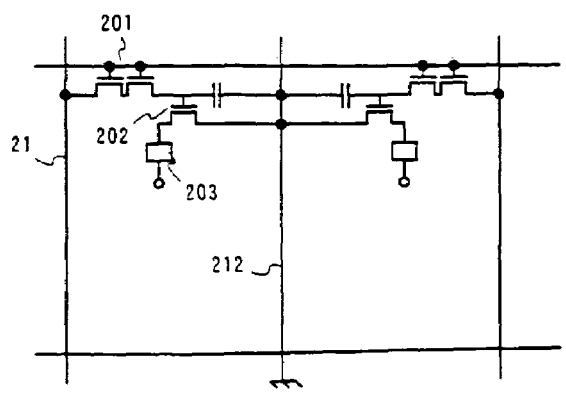

FIG. 2 is a sectional view of a pixel portion of an EL display device of the present invention, FIG. 3A is a top view thereof, and FIG. 3B is a view showing its circuit structure. Actually, pixels are arranged in a matrix form to form a pixel portion (image display portion). Incidentally, a sectional view taken along A–A' of FIG. 3A corresponds to FIG. 2. Thus, since common numerals are used in FIG. 2 and FIGS. 3A and 3B, reference may be suitably made to the both drawings. Although the top view of FIG. 3 shows two pixels, both have the same structure.

In FIG. 2, reference numeral 11 designates a substrate; and 12, an insulating film (hereinafter referred to as an under film) which becomes an under layer. As the substrate 11, a substrate made of glass, glass ceramic, quartz, silicon, ceramic, metal or plastic can be used.

Although the under film 12 is effective especially in the case where a substrate including a movable ion or a conductive substrate is used, it is not necessary to provide the under film on a quartz substrate. As the under film 12, an insulating film containing silicon may be used. In the present specification, the "insulating film containing silicon" indicates an insulating film containing silicon, oxygen, or nitrogen at a predetermined ratio, such as a silicon oxide film, a silicon nitride film, or a silicon nitride oxide film (expressed by SiOxNy).

To dissipate heat of a TFT by making the under film 12 have a heat radiation effect is effective also in preventing deterioration of the TFT or deterioration of the EL element. Any well-known materials can be used for providing the heat radiation effect.

Here, two TFTs are formed in a pixel. Reference numeral 201 designates a switching TFT which is formed of an n-channel TFT; and 202, a current controlling TFT which is formed of a p-channel TFT.

However, in the present invention, it is not necessary that the switching TFT is limited to the n-channel TFT and the current controlling TFT is limited to the p-channel TFT, but a modification can be made such that the switching TFT is made the p-channel TFT and the current controlling TFT is made the n-channel TFT, or both use the n-channel TFTs or the p-channel TFTs.

The switching TFT 201 includes a source region 13, a drain region 14, LDD region 15a to 15d, an active layer including a high concentration impurity region 16 and channel formation regions 17a and 17b, a gate insulating film 18, gate electrodes 19a and 19b, a first interlayer insulating film 20, a source wiring 21, and a drain wiring 22.

Besides, as shown in FIGS. 3A and 3B, the gate electrodes 19a and 19b have a double gate structure in which they are electrically connected to a gate wiring 211 formed of another material (material having resistance lower than the gate electrodes 19a and 19b). Of course, not only the double gate structure, but also a single gate or a so-called multigate structure (structure including an active layer having at least two channel formation regions connected in series) such as a triple gate structure may be adopted. The multigate structure is very effective in decreasing an off current value, and in the present invention, the switching element 201 of the pixel is made the multigate structure so that the switching element having a low off current value is realized.

The active layer is formed of a semiconductor film containing a crystalline structure. That is, a single crystal semiconductor film may be used, a polycrystalline semiconductor film or a microcrystalline semiconductor film may be used. The gate insulating film 18 may be formed of an insulating film containing silicon. Any conductive film may be used for the gate electrode, the source wiring or the drain wiring.

Further, in the switching TFT 201, the LDD regions 15a to 15d are provided not to overlap with the gate electrodes 19a and 19b through the gate insulating film 18. This sort of structure is very effective in decreasing the off current value.

Note that it is further preferable to provide an offset region (region made of a semiconductor layer of the same composition as the channel formation region and a gate voltage is not applied) between the channel formation region and the LDD region, in view of decreasing the off current value. In the case of the multigate structure having at least two gate electrodes, the high concentration impurity region provided between the channel formation regions is effective in decreasing the off current value.

Next, the current controlling TFT 202 includes an active layer including a source region 31, a drain region 32 and a channel formation region 34, a gate insulating film 18, a gate electrode 35, a first interlayer insulating film 20, a source wiring 36, and a drain wiring 37. Although the gate electrode 35 has a single gate structure, a multigate structure may be adopted.

As shown in FIG. 3, the drain of the switching TFT is connected to the gate of the current controlling TFT 202. Specifically, the gate electrode 35 of the current controlling TFT 202 is electrically connected to the drain region 14 of the switching TFT 201 through the drain wiring (which can also be called a connection wiring) 22. The source wiring 36 is connected to a power supply line 212.

The current controlling TFT 202 is an element for controlling the quantity of current injected to an EL element 203, and it is not preferable to cause a large amount of current to flow in view of deterioration of the EL element. Thus, it is preferable to design a channel length (L) to be sufficiently long so that excessive current does not flow through the current controlling TFT 202. It is designed to desirably make the current 0.5 to 2 µA per pixel (preferably 1 to 1.5 µA).

The length (width) of the LDD region formed in the switching TFT 201 is made 0.5 to 3.5 µm, typically 2.0 to 2.5 µm.

As shown in FIG. 3A, a wiring containing the gate electrode 35 of the current control TFT 202 is overlaped with a power source supply line 212 through an insulating film in a region denoted by the reference numeral 50. A storage capacitor (condenser) is formed in the region denoted by the reference numeral 50. It is also possible use a capacitor formed by a semiconductor film 51, an insulating film (not shown in the figure) in the same layer as the gate insulating film, and the power source supply line 212 as the storage capacitor. The storage capacitor 50 functions as a condenser for maintaining the voltage applied to the gate electrode 35 of the current control TFT 202.

From the viewpoint of increasing the quantity of current which can flow, it is also effective to increase the thickness (preferably 50 to 100 nm, more preferably 60 to 80 nm) of the active layer (especially the channel formation region) of the current controlling TFT 202. On the contrary, in the case of the switching TFT 201, from the viewpoint of decreasing the off current value, it is also effective to decrease the thickness (preferably 20 to 50 nm, more preferably 25 to 40 nm) of the active layer (especially the channel formation region).

Next, reference numeral 38 designates a first passivation film, and it is appropriate that its film thickness is made 10 nm to 10 µm (preferably 200 to 500 nm). As its material, an insulating film containing silicon (especially a silicon nitride oxide film or a silicon nitride film is preferable) can be used.

A second interlayer insulating film (which may be called a flattening film) 39 is formed on the first passivation film 38 to cover the respective TFTs, so that a step formed by the TFTs is flattened. As the second interlayer insulating film 39, an organic resin film is preferable, and it is preferable to use polyimide, polyamide, acrylic resin, BCB (benzocyclobutene) or the like. Of course, if sufficient flattening can be made, an inorganic film may be used.

It is very important to flatten the step, which is produced by the TFT, through the second interlayer insulating film 39. Since an EL layer formed later is very thin, there is a case where poor luminescence occurs due to existence of a step. Accordingly, it is desirable to make flattening before a pixel electrode is formed, so that the EL layer can be formed on the flattest surface as much as possible.

Reference numeral 40 designates a pixel electrode (corresponding to an anode of the EL element) made of a transparent conductive film, and after a contact hole (opening) is formed in the second interlayer insulating film 39 and the first passivation film 38, the pixel electrode is formed to be connected to the drain wiring 37 of the current controlling TFT 202 at the formed opening portion.

In this embodiment, a conductive film made of a compound of indium oxide and tin oxide is used as the pixel electrode. Besides, a small amount of gallium may be added to this. Further, a compound of indium oxide and zinc oxide or a compound of zinc oxide and gallium oxide can also be used. Note that a recess produced after a pixel electrode is formed on a contact hole is called an electrode hole in this specification.

After the pixel electrode is formed, banks 41 made of resin material are formed. The banks 41 are formed by patterning an acrylic resin film or a polyimide film having a thickness of 1 to 2 µm. The banks 41 are respectively formed like a stripe between pixel arrays. In this embodiment, although they are formed along the source wiring 21, they may be formed along the gate wiring 35.

Next, an EL layer 42 is formed with the electric field application method as explained in FIG. 1C. Although only one pixel is shown here, EL layers corresponding to the respective colors of R (red), G (green) and B (blue) are formed.

As the organic EL material used for the EL layer, a polymer material is used. As a typical polymer material, polyparaphenylene vinylene (PPV), polyvinylcarbazole (PVK), polyfluorene or the like is named.

Although there are various types as the PPV organic EL material, for example, the following molecular formula is published ("H. Shenk, H. Becker, O. Gelsen, E. Kluge, W. Kreuder, and H. Spreitzer, "Polymers for Light Emitting Diodes", Euro Display, Proceedings, 1999, p. 33–37").

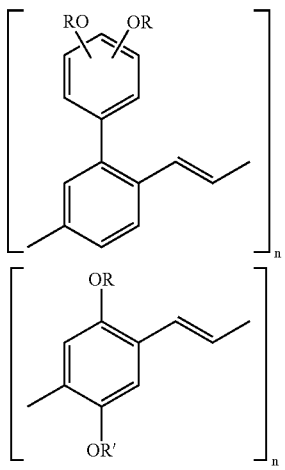

Besides, polyphenylvinyl of a molecular formula disclosed in Japanese Patent Application Laid-open No. Hei. 10-92576 can also be used. The molecular formula is as follows:

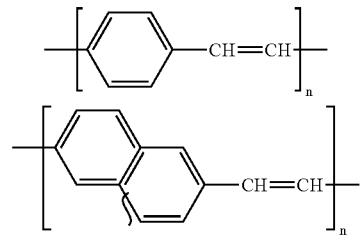

Besides, as the PVK organic EL material, there is a molecular formula as follows:

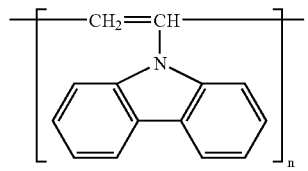

The polymer organic EL material can be dissolved in a solvent when it is in a state of polymer and can be coated, or can be dissolved in a solvent when it is in a state of monomer and can be polymerized after coating. In the case where it is coated in the state of monomer, a polymer precursor is first formed and is polymerized by heating in vacuum so that a polymer is formed.

As a specific EL layer, it is appropriate that cyanopolyphenylenevinylene is used for the EL layer emitting red light, polyphenylenevinylene is used for the EL layer emitting green light, and polyphenylenevinylene or polyalkylphenylene is used for the EL layer emitting blue light. It is appropriate that its thickness is made 30 to 150 nm (preferably 40 to 100 nm).

However, the above examples are merely examples of the organic EL material which can be used as the EL layer of the present invention, and it is not necessary to limit the material to these. In this embodiment, the mixture of the organic EL material and the solvent is coated with the electric field application system shown, and the solvent is volatilized to remove, so that the EL layer is formed. Accordingly, as long as the combination is such that the temperature when the solvent is volatilized does not exceed the glass transition temperature of the EL layer, any organic EL material may be used, a low molecular material which is not mentioned here, or a high molecular material with a low molecular material may be used.

Toluene, xylene, chlorobenzene, dichlorobenzene, anisole, chloroform, dichloromethane, δ-butyl lactone, butyl cellosolve, cyclohexane, NMP (N-methyl-2-pyrolidone), cyclohexanone, dioxane, or THF (tetrahydrofuran) are exemplified as typical solvents. It is to be noted that a solution in which the above-mentioned EL material is dissolved is referred as an application liquid throughout the present invention. Further, it is preferable that the viscosity of the application liquid is between $1\times10^{-3}$ and $3\times10^{-2}$ Pa·s.

First, the application liquid prepared in the material chamber 111 is atomized by the ultrasonic oscillator 112 as shown in FIG. 1C. When the atomized application liquid become charged particles through the influence of an electric field from the electrode 114 that is provided on the nozzle 113, then the application liquid is extracted from the nozzle 113 by the leading electrode 115. After the extracted application liquid is accelerated by the accelerating electrode 116, the application liquid is then controlled by the controlling electrode 117 and applied on the desired position. The EL layer is thus formed. It is to be noted that the application liquid is charged by the influence of the electric field of the electrode 114 that is attached to the nozzle 113 at the moment pf spurting out from the material chamber 111, whereby it becomes charged particles.

In the present invention, first, the application liquid for a red color EL layer that is provided in the material chamber 111, is atomized and controlled by an electric field, then applied to thereby form a row of pixels to luminesce a red color. Next, while moving the substrate by three rows in the direction of the adjacent row of pixels, the formation of rows of pixels to luminesce the red color is carried out at every two rows. The application liquid for a green color EL layer that is prepared in the material chamber 111 is next applied in the same way to thereby form rows of pixels to luminescence the green color at every two rows. Furthermore, the application liquid for a blue color EL layer that is prepared in the material chamber 111 is applied in the same way as the others to thereby form rows of pixels to luminescence the blue color.

By performing the above operation, a plurality of three rows of red, green, and blue pixels lined up in stripe shapes can be formed on the substrate.

Note that every time the kind of application liquid for the EL layer is changed, the material chamber 111 that is provided with the application liquid for the EL layer may be changed together therewith, or the material chamber 111 may be used with only changing the application liquids and not the material chamber. In addition, the nozzle 113 that is attached to the material chamber 111 is not limited to one nozzle, but two or more nozzles may be attached.

Further, although not used herein, a mask may be provided between the material chamber 111 and the substrate to thereby control the positions on the substrate at which the application liquid is via the mask. It is to be noted that the material chamber 111 and the mask may be provided separately, or they may be integrated into the device.

During the formation of the EL layer 42, the atmosphere for processing is an atmosphere that contains little moisture and oxygen because the EL layer is easily degraded due to the presence of moisture and oxygen. That is, it is desirable to perform the formation of the EL layer in an inert gas such as nitrogen or argon. Further, an atmosphere of the solvent that is employed in preparing the application liquid may be employed as the atmosphere for processing scince the evaporation rate of the application liquid can be controlled.

Thus, after forming the EL layer 42, a cathode 43 made of a light shielding conductive film and a protective electrodeb 44 are formed. In Embodiment 1, a conductive film made of MgAg is used as the cathode 43 and a conductive film made of aluminum is used as the protective electrode 44.

It is to be noted that the above-mentioned EL layer is inferior to heat, and therefore it is desirable that the cathode 43 is formed at a the possiblelowest temperature (preferably within the temperature range from room temperature to 120° C.). Accordingly, plasma CVD and sputtering are observed as desirable film deposition methods. Further, the substrate completed up to this point is referred as an active matrix substrate throughout the present specification.

In the present invention, after forming a barrier layer 45 that is made of an inorganic film such as silicon nitride, tantalum oxide, or carbon, a cover layer 46 that is made of an organic resin film is formed by using the electric field application method explained in FIG. 1C. A preferred viscosity of the organic resin liquid that is used for forming the cover layer 46 at this point is set between $1 \times 10^{-3}$ and $3 \times 10^{-2}$ Pa·s. In addition, the film thickness of the cover layer formed at this point is preferably 0.1 μm to 20 μm. However, it is possible to make the film thickness thereof thicker than the above stated range by repeating the application and drying processes.

The sealing of the self-light emitting device is completed when the cover layer 46 is formed. However, a sealing substrate such as a glass substrate, a quartz substrate, or a plastic substrate may be provided on the cover layer 46 to thereby complete the sealing structure of the self-light emitting device. It is also to be noted that the cover layer 46 may be made to have the role of functioning as an adhesive for bonding the active matrix substrate and the sealing substrate.

Note that as a countermeasure against moisture and oxygen which are cause of degrading the EL layer, a dry agent or an anti-oxidant such as barium oxide may be added into the cover layer made of an organic resin film.

Embodiment 2

In Embodiment 2 of the present invention, an explanation is made on a method of manufacturing at the same time a pixel portion and a TFT of a driver circuit that is provided in the periphery of the pixel portion with reference to FIGS. 4A to 6C. However, in order to simplify the explanation, a CMOS circuit, which is the basic circuit for the driver circuit, is shown in the figures.

First, as shown in FIG. 4A, a base film 301 is formed to a thickness of 300 nm on a glass substrate 300. A lamination film constituting a 100 nm thick silicon oxynitride film and a 200 nm thick silicon oxynitride film is used as the base film 301 in Embodiment 2. At this point, it is appropriate to set the nitrogen concentration of the silicon oxynitride film that is in contact with the glass substrate 300 to between 10 and 25 wt %. Of course, an element may be directly formed on the quartz substrate without the provision of the base film.

Next, an amorphous silicon film (not shown in the figure) is formed to a thickness of 50 nm on the base film 301 by using a known film deposition method. Note that the present invention is not necessarily limited to using the amorphous silicon film, but a semiconductor film containing an amorphous structure (including a microcrystal semiconductor film) may be used. In addition, a compound semiconductor film containing an amorphous structure such as an amorphous silicon germanium film may also be used, and the film thickness thereof may be between 20 and 100 nm.

The amorphous silicon film is then crystallized by a known method to thereby form a crystal silicon film (also referred to as polycrystal silicon film or a polysilicon film) 302. Thermal crystallization using an electric furnace, laser annealing crystallization using laser light, and lamp annealing crystallization using infrared light exist as known crystallization methods. Crystallization is performed in Embodiment 2 using light from an excimer laser which uses XeCl gas.

Note that the pulse emission type excimer laser light processed into a linear shape is used in Embodiment 2, but a rectangular shape may also be used, and that continuous emission argon laser light and continuous emission excimer laser light can also be used.

In Embodiment 2, although the crystal silicon film is used as the active layer of the TFT, it is also possible to use an amorphous silicon film. Furthermore, it is also possible to used the amorphous silicon to form the active layer of the switching TFT, which requires a lowering of the OFF current value, while using the crystal silicon film to form the active layer of the current controlling TFT. Carrier mobility is low in the amorphous silicon film, and therefore it is difficult for a current to flow therein, and as a result, it is difficult for an OFF current to flow. That is, the merits of both the amorphous silicon film in which it is hard to flow a current therein and the crystal silicon film in which it is easy to flow a current therein can be utilized advantageously.

Next, as shown in FIG. 4B, a protective film 303 made of a silicon oxide film is formed to a thickness of 130 nm on the crystal silicon film 302. The thickness thereof may be chosen from the range of 100 to 200 nm (preferably between 130 and 170 nm). Furthermore, other films may also be used provided that they are insulating films containing silicon. The protective film 303 is provided so that the crystal silicon film is not directly exposed to plasma during the doping of an impurity, and so that it is possible to have delicate concentration control of the impurity.

Resist masks 304a and 304b are then formed on the protective film 303, and an impurity element that imparts n-type conductivity (hereafter referred to as an n-type impurity element) is doped therein through the protective film 303. Note that elements belonging to the Group 15 are generally used as the n-type impurity element. Typically, phosphorous or arsenic can be used. Also note that in Embodiment 2, a plasma (ion) doping method in which phosphine ($PH_3$) is plasma activated without separation of mass is used, and that phosphorous is doped at a concentration of $1 \times 10^{18}$ atoms/cm$^3$. The ion implantation method, in which separation of mass is performed, may also be used, of course.

In an n-type impurity region 305 thus formed by this process, the dose amount of the n-type impurity element contained therein is regulated so that the concentration thereof is $2 \times 10^{16}$ to $5 \times 10^{19}$ atoms/cm$^3$ (typically between $5 \times 10^{17}$ and $5 \times 10^{18}$ atoms/cm$^3$).

Next, as shown in FIG. 4C, the protective film 303 and the resists 304a and 304b are removed to thereby activate the element belonging to Group 15 that is doped therein. A known activation technique may be used as the means of activation, and in Embodiment 2, activation is conducted by irradiation of an excimer laser light. Without being necessarily limited to the use of the excimer laser light, a pulse emission type excimer laser and a continuous emission type excimer laser may both, of course, be used. The aim here is the activation of the doped impurity element, and therefore it is preferable that irradiation is performed at an energy level at which the crystal silicon film does not melt. Note that the laser irradiation may also be performed with the protective film 303 in place.

It is to be noted that during the activation of the impurity element by laser light, activation by heat treatment may also be performed along therewith. When activation is performed by heat treatment, considering the heat resistance of the substrate, it is appropriate to perform heat treatment on the order of 450 to 550° C.

Due to this process, edge portions of the n-type impurity region 305, that is, a boundary portion (connecting portion) and regions existing in the periphery of the n-type impurity regions 305 and not doped with the impurity element will become distinct. This means that, at the point when the TFTs are later completed, extremely good connections can be formed between LDD regions and channel forming regions.

As shown in FIG. 4D, unnecessary portions of the crystal silicon film are removed next to thereby form island-like semiconductor films (hereinafter referred to as active layers) 306 to 309.

Then, as shown in FIG. 4E, a gate insulating film 310 is formed covering the active layers 306 to 309. An insulating film containing silicon and having a thickness of 10 to 200 nm, preferably between 50 and 150 nm, may be used as the gate insulating film 310. The film thereof may take a single layer structure or a lamination structure. A 110 nm thick silicon oxynitride film is used in Embodiment 2.

A 200 to 400 nm thick conductive film is formed next and patterned, thereby forming gate electrodes 311 to 315. The edge portions of the gate electrodes 311 to 315 may be formed into taper shapes. Note that in Embodiment 2, the gate electrodes and lead wirings that are electrically connected to the gate electrodes (hereinafter referred to as gate wirings) are formed from different materials. Specifically, a material having a lower resistance than that of the gate electrodes is used for forming the gate wirings. The reason for this resides in that a material which is capable of being micro-processed is used as the gate electrodes, and even if the material for the gate wirings cannot be micro-processed, the material used for the wirings has low resistance. Of course, the gate electrodes and the gate wirings may also be formed from the same material.

Further, the gate electrodes may be formed from a single layer conductive film, and when necessary, it is preferable to use a two layer or a three layer lamination film. All known conductive films can be used as the material for the gate electrodes. However, as stated above, it is preferable to use a material which can be micro-processed, specifically, a material which can be patterned to a line width of 2 m or less.

Typically, it is possible to use a film made of an element selected from the group consisting of tantalum (Ta), titanium (Ti), molybdenum (Mo), tungsten (W), chromium (Cr), and silicon (Si), or a nitride film containing the above elements (typically a tantalum nitride film, tungsten nitride film, or a titanium nitride film), or an alloy film having a combination of the above elements (typically Mo—W alloy, Mo—Ta alloy), or a silicide film of the above elements (typically a tungsten silicide film or a titanium silicide film). Of course, the films may be used as a single layer or a laminate layer.

A lamination film that is composed of a 50 nm thick tantalum nitride (TaN) film and a 350 nm thick tantalum (Ta) film is used in Embodiment 2. These films may be formed by sputtering. Further, when an inert gas such as Xe, Ne or the like is added as a sputtering gas, peeling of the films due to stress can be prevented.

At this point, the gate electrode 312 is formed so as to overlap a portion of the n-type impurity region 305 and sandwiching the gate insulating film 310. This overlapping portion later becomes an LDD region overlapping the gate electrode. Note that in a cross-sectional view, the gate electrodes 313 and 314 can be seen as two electrodes, but they are actually electrically connected.

Figure 5A:
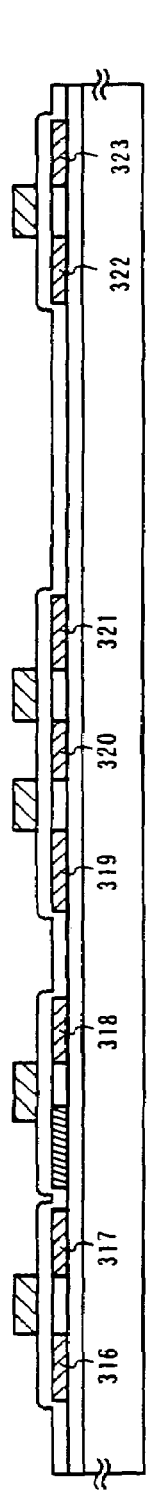
FIGS. 5A to 5D are views showing a manufacturing process of a self-light emitting device.

Next, an n-type impurity element (phosphorous is used in Embodiment 2) is doped in a self-aligning manner using the gate electrodes 311 to 315 as masks as shown in FIG. 5A. The doping of phosphorous is regulated so that it can be doped into the impurity regions 316 to 323 thus formed at a concentration of $\frac{1}{10}$ to $\frac{1}{2}$ that of the impurity regions 305 and 306 (typically between ¼ and ⅓). Specifically, a concentration of $1 \times 10^{16}$ to $5 \times 10^{18}$ atoms/cm$^3$ (typically $3 \times 10^{17}$ to $3 \times 10^{18}$ atoms/cm$^3$) is preferable.

Figure 5B:
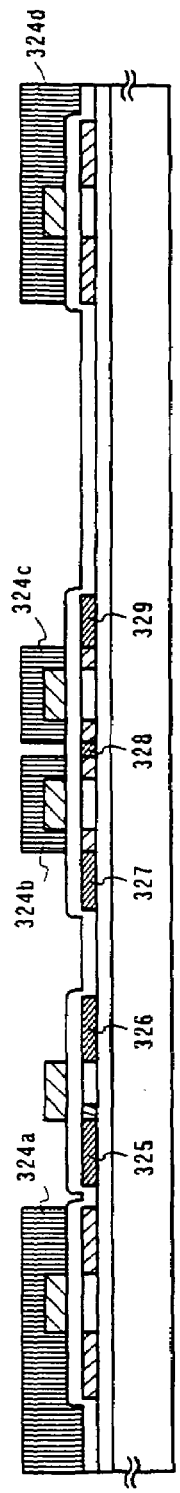

As shown in FIG. 5B, resist masks 324a to 324d are formed next covering the gate electrodes and the like, and an n-type impurity element (phosphorous is used in Embodiment 2) is doped to thereby form impurity regions 325 to 329 containing a high concentration of phosphorous. Ion doping using phosphine ($PH_3$) is also performed here, and the concentration of phosphorous in these regions is regulated so that it is between $1\times10^{20}$ and $1\times10^{21}$ atoms/cm$^3$ (typically between $2\times10^{20}$ and $5\times10^{21}$ atom/cm$^3$).

A source region or a drain region of the N channel TFT is formed through this process, and in the switching TFT, a portion of the n-type impurity regions 319 to 321 formed through the process of FIG. 5A remains. These remaining regions correspond to the LDD regions 15a to 15d of the switching TFT in FIG. 5.

Figure 5C:
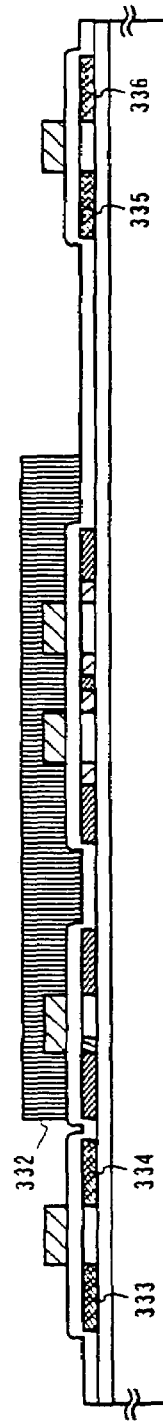

Next, as shown in FIG. 5C, the resist masks 324a to 324d are removed, and a new resist mask 332 is formed. A p-type impurity element (boron is used in Embodiment 2) is then doped to thereby form impurity regions 333 and 336 containing a high concentration of boron. Boron is doped here by ion doping using diborane ($B_2H_6$) so that the concentration thereof is $3\times10^{20}$ to $3\times10^{21}$ atoms/cm$^3$ (typically between $5\times10^{20}$ and $1\times10^{21}$ atoms/cm$^3$).

Note that phosphorous has already been doped into the impurity regions 333 to 336 at a concentration of $1\times10^{20}$ to $1\times10^{21}$ atoms/cm$^3$, but boron is doped here at a concentration of at least 3 times higher than that of phosphorous. Therefore, the n-type impurity regions that have been formed in advance are completely inverted to p-type conductivity, and function as p-type impurity regions.

Next, after removing the resist mask 332, the n-type and p-type impurity elements doped at respective concentrations are activated. Furnace annealing, laser annealing, or lamp annealing may be performed as a means of activation. Heat treatment is performed in Embodiment 1 under a nitrogen atmosphere for 4 hours at 550° C. in an electric furnace.

It is important to remove as much as possible the oxygen contained in the atmosphere at this point. This is because if any small traces of oxygen exists, then the exposed surface of the electrode are oxidized, inviting an increase in resistance, and at the same time, it becomes more difficult to make an ohmic contact later. It is therefore preferable that the concentration of oxygen in the processing environment in the above activation process is set to 1 ppm or less, desirably 0.1 ppm or less.

Figure 5D:
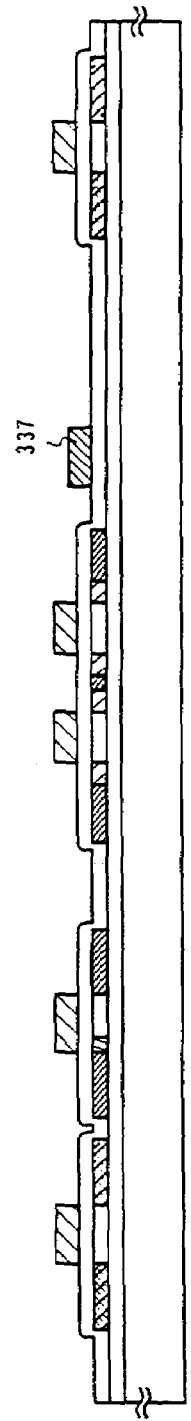

After the activation process is completed, a gate wiring 337 is formed next to a thickness of 300 nm as shown in FIG. 5D. A metallic film having aluminum (Al) or copper (Cu) as its principal component (occupying 50 to 100% as a composition) may be used as the material of the gate wiring 337. Regarding the placement of the gate wiring 337, it is formed so that the gate wiring 211 and the gate electrodes 19a and 19b of the switching TFT (corresponding to gate electrodes 313 and 314 of FIG. 4E) are electrically connected as in FIG. 3.

The wiring resistance of the gate wiring can be made extremely small by forming such type of structure, and therefore a pixel display region (pixel portion) having a large surface area can be formed. That is, the pixel structure of Embodiment 1 is extremely effective because a self-light emitting device having a screen size of a 10 inch diagonal or larger (in addition, a 30 inch or larger diagonal) is realized due to this structure.

Next, as shown in FIG. 6A, a first interlayer insulating film 338 is formed. As the first interlayer insulating film 336, either a single layer insulating film containing silicon is used, or a lamination film in which 2 or more types of insulating film containing silicon are combined may be used. Further, it is appropriate to set the film thickness thereof between 400 nm and 1.5 µm. A structure in which an 800 nm thick silicon oxide film is formed laminated on a 200 nm thick silicon oxide nitride film is used in Embodiment 2.

Additional heat treatment is performed under an atmosphere containing 3% to 100% of hydrogen for 1 to 12 hours at a temperature of between 300° C. and 450° C. to thereby perform hydrogenation. This process is one for terminating the dangling bonds in the semiconductor film caused by thermally excited hydrogen. Plasma hydrogenation (using hydrogen excited by a plasma) may be performed as another means of hydrogenation.

Note that the hydrogenation step may also be inserted between the step of forming of the first interlayer insulating film 338. That is, hydrogenation processing such as the one above may be performed after forming the 200 nm thick silicon oxide nitride film, and then the remaining 800 nm thick silicon oxide film may be formed thereafter.

Next, a contact hole is formed in the first interlayer insulating film 338 and the gate insulating film 310 to thereby form source wirings 339 to 342 and drain wirings 343 to 345. It is to be noted that in Embodiment 2, this electrode is made of a lamination film of a three layer structure in which a titanium film having a thickness of 100 nm, an aluminum film containing titanium and having a thickness of 300 nm, and a titanium film having a thickness of 150 nm are formed in succession by sputtering. Of course, other conductive films may be used.

Next, a first passivation film 346 is formed to a thickness of 50 to 500 nm (typically between 200 and 300 nm). A 300 nm thick silicon oxide nitride film is used as the first passivation film 346 in Embodiment 2. This may also be substituted with a silicon nitride film.

Note that it is effective to perform plasma process using a gas containing hydrogen such as $H_2$ or $NH_3$ prior to the formation of the silicon oxide nitride film. Hydrogen activated by this preprocess is supplied to the first interlayer insulating film 338, and the film quality of the first passivation film 346 is improved by performing heat treatment. At the same time, the hydrogen added to the first interlayer insulating film 338 diffuses to the lower layer side, and therefore the active layers can be effectively hydrogenated.

Next, as shown in FIG. 6B, a second interlayer insulating film 347 made of an organic resin is formed. As the organic resin, materials such as polyimide, polyamide, acrylic resin, or BCB (benzocyclobutene) can be used. In particular, because the second interlayer insulating film 347 is primarily used for leveling, acrylic resin that has excellent leveling properties is preferable. In Embodiment 2, an acrylic resin film is formed to a thickness sufficient to level a step difference formed by TFTs. A preferred film thickness thereof is between 1 to 5 µm (more preferably between 2 and 4 µm).

A contact hole is formed in the second interlayer insulating film 347 and the first passivation film 346 to thereby form a pixel electrode 348 to be electrically connected to the drain wiring 345. In Embodiment 2, an indium tin oxide (ITO) film is formed to a thickness of 110 nm, and patterning is carried out to thereby form the pixel electrode. Incidentally, as other materials, it is also possible to use a compound in which 2 to 20% of zinc oxide (ZnO) is mixed in indium oxide or a compound constituting zinc oxide and gallium oxide may be used as a transparent electrode. The pixel electrode 348 becomes the anode of the EL element.

As shown in FIG. 6C, a bank 349 of a resin material is formed next. The bank 349 may be formed of an acrylic resin film or a polyimide film, which has a total film thickness of between 1 to 2 µm, with patterning. The bank 349 is formed in stripe shapes between the rows of pixels as shown in FIG. 6C. In Embodiment 2, the bank 349 is formed along the source wiring 341, but it may be formed along the gate wiring 337.

An EL layer 350 is formed next using the electric field application method explained with reference to FIG. 1C. It is to be noted that although only one pixel is shown here, the EL layers corresponding to the respective colors R (red), G (green), and B (blue) are formed as explained in Embodiment 1.

First, the application liquid for forming the EL layer provided in the material chamber is atomized with ultrasonic oscillation by the ultrasonic oscillator. When the atomized application liquid for forming the EL layer is charged by an electric field imparted by a voltage that is applied to the electrode, then the application liquid can be extracted by a leading electrode that is attached to the exterior of the material chamber. After the extracted EL layer application liquid is accelerated by the accelerating electrode in a flying direction, the application liquid is then controlled by the controlling electrode to thereby be applied on the desired position on the substrate 110.

In the present invention, first, an application liquid for a red color EL layer is extracted from the material chamber as an atomized application liquid for forming the EL layer by the leading electrode. Then, after being accelerated by the accelerating electrode, the application liquid is controlled by the controlling electrode to thereby form an EL layer on the rows of pixels to luminesce a red color. Next, after moving the substrate in the lateral direction, the application liquid for forming the green color EL layer from the material chamber is applied to thereby form rows of pixels to luminesce the green color. The substrate is then further moved in the lateral direction so that the application liquid for forming the blue color EL layer from the material chamber is applied to thereby form rows of pixels to luminesce the blue color.

A three-colored stripe shaped EL layer is thus formed by sequentially applying the application liquid to the rows of pixels to luminesce each of the colors red, green, and blue while moving the substrate. It is to be noted that although only one pixel is shown in Embodiment 2, the EL layers to luminesce the same color may be formed one row at a time or all at the same time. Further, when necessary, a mask may be provided between the material chamber and the substrate to thereby control the application position of the application liquid by applying electric field to the mask.

As an EL material, a cyano-polyphenylene vinylene may be used for the EL layer to luminesce a red color; a polyphenylene vinylene for the EL layer to luminesce a green color; and a polyphenylene vinylene or a polyalkylphenylene for the EL layer to luminesce a blue color in Embodiment 2. An appropriate film thickness thereof is 30 to 150 nm (preferably between 40 and 100 nm).

A known material may be used to form the EL layer 350. Taking the driving voltage into consideration, it is preferable that an organic material is used. It is to be noted that, in Embodiment 2, the EL layer 350 is formed from the above EL material, that is, it takes a single layer structure of a light emitting layer only. However, an electron injecting layer, an electron transporting layer, a hole transporting layer, a hole injecting layer, an electron preventing layer, or a hole element layer may be provided if necessary. Although the MgAg electrode is used as the cathode 351 of the EL element in Embodiment 2, other well-known materials may be used.

The electric field application method controlled by an electric field has been shown here in Embodiment 2. However, other methods such as the ink jet method or a method in which the material for the EL layer is controlled and applied as charged particles may also be employed.

Note that although the light emitting layer is applied and formed each color, in the case of forming the electron injecting layer, the electron transporting layer, the hole transporting layer, the hole injecting layer, the electron preventing layer, or the hole element layer, the layers made of the different material may all be formed at once by using methods such as the spin coating method and the application method.

A cathode (MgAg electrode) 351 is formed by vacuum evaporation after the formation of the EL layer 350. It is to be noted that the film thickness of the EL layer 350 may appropriately be between 80 and 200 nm (typically between 100 and 120 nm) and the thickness of the cathode 351 between 180 and 300 nm (typically between 200 and 250 nm).

A protective electrode 352 is further provided on the cathode 351. A conductive film containing aluminum as its main constituent may be used as the protective electrode 352. The protective electrode 352 may be formed by vacuum evaporation using a mask. Note that the state of the substrate with the protective electrode formed on the top is referred as an active matrix substrate throughout the present specification.

A barrier layer 353 is further formed thereon so that the active matrix substrate that is completed up to the formation of the protective electrode 352 is not exposed to the open air. In Embodiment 2, tantalum oxide is used as the material for forming the barrier layer 353. However, an inorganic material such as a silicon nitride, an aluminum nitride, or a carbon, specifically a DLC, may be used. The barrier layer 353 is formed by employing sputtering In Embodiment 2, although a film deposition method performed at room temperature such as plasma CVD can also be employed.

After forming the barrier layer 353, a cover layer 354 made of an organic resin is formed on the barrier layer 353. Note that, after dissolving the organic resin in a solvent and moderately regulating the viscosity of the organic resin itself to thereby manufacture an organic resin liquid, the organic resin liquid is then provided in the material chamber and applied by the electric field application method, thereby forming the cover layer 354. It is preferable that the viscosity of the organic resin liquid at this point is between $1 \times 10^{-3}$ and $3 \times 10^{-2}$ Pa·s.

Further, at this point, the addition of an absorbent or an anti-oxidant such as barium oxide inside the organic resin liquid for forming the cover layer is effective in preventing moisture and oxygen, which are the degrading factors of the EL element, from penetrating into the EL element.

In the case of Embodiment 2, as shown in FIG. 6C, the active layer of the N channel TFT 205 includes a source region 355, a drain region 356, an LDD region 357 and a channel formation region 358, and the LDD region 357 overlaps with the gate electrode 312 through the gate insulating film 310 sandwiched therebetween.

The reason for forming the LDD region only at the side of the drain region resides in the consideration of not dropping the operating speed. Further, it is not necessary to pay very much attention to the OFF current value in the N channel TFT 205, but rather, it is better to place importance on the operating speed. Accordingly, it is desirable that the LDD region 357 is made to completely overlap with the gate electrode to reduce the resistive component to a minimum. That is, it is preferable to remove the so-called offset.

In the active matrix substrate of Embodiment 2, a TFT of an optimum structure is not only provided in the pixel portion but also in the driver circuit portion. Therefore, very high reliability is attained and operating characteristics are improved.

First, a TFT with a structure that can reduce hot carrier injection so as not to drop the operating speed thereof as much as possible is used as the N channel TFT 205 of a CMOS circuit forming the driver circuit portion. Incidentally, the driver circuit here includes a shift register, a buffer, a level shifter, a sampling circuit (sample and hold circuit) and the like. In the case of performing digital driving, a signal conversion circuit such as a D/A converter is also included therein.

Next, the cross-sectional structure of an N channel switching TFT as the TFT of the pixel portion will be explained with reference to FIGS. 7A and 7B. Note that the reference numerals used here correspond to those of FIG. 2.

Figure 7A:
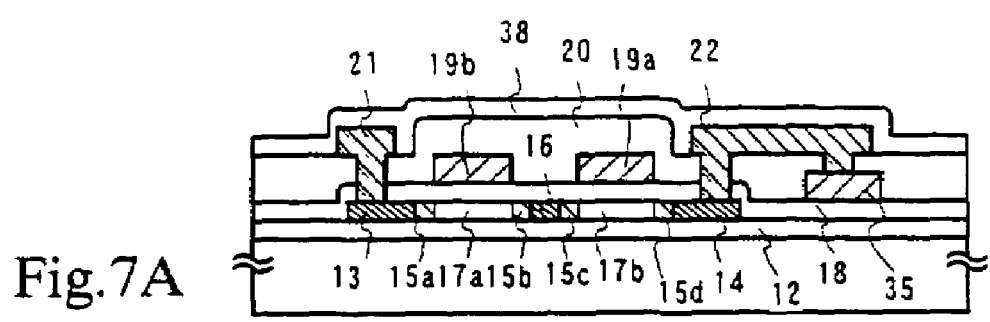
FIGS. 7A and 7B are views showing a cross-sectional structure of a TFT of a pixel portion.

First, in the structure thereof shown in FIG. 7A, the LDD regions 15a to 15b are provided so as not to overlap with the gate electrodes 19a and 19b through the gate insulating film 18 sandwiched therebetween. Such structure is very effective in lowering the OFF current value.

Figure 7B:
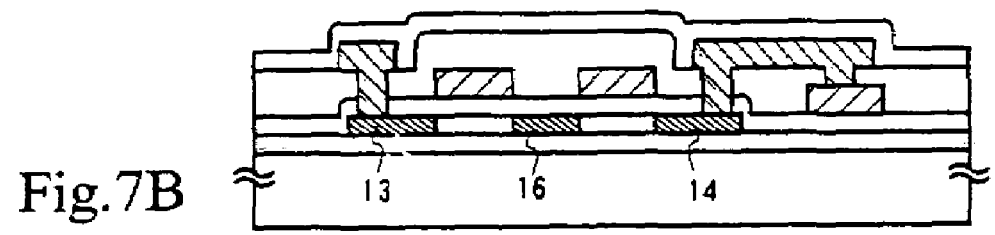

On the other hand, in the structure thereof shown in FIG. 7B, the LDD regions 15a to 15d are not provided. In the case of adopting the structure of FIG. 7B, productivity can be improved because the number of processes can be reduced when compared with case of forming the structure of FIG. 7A.

In the present invention, a TFT may take either of the structures shown in FIGS. 7A and 7B as the switching TFT.

Figure 8A:
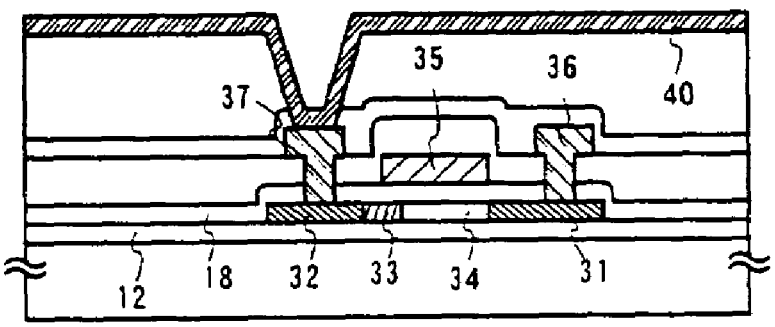
FIGS. 8A and 8B are views showing a cross-sectional structure of a TFT of a pixel portion.
Figure 8B:
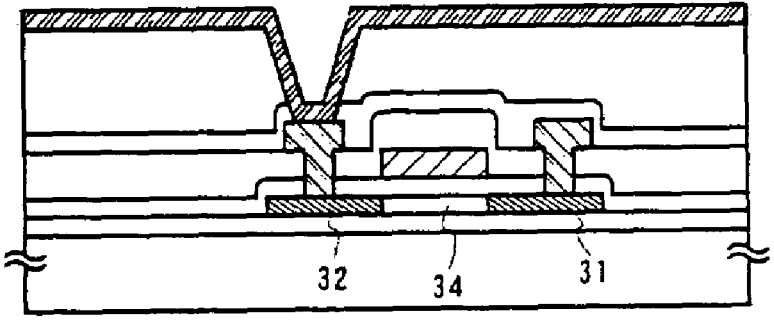

Next, the cross-sectional structure views of an N channel current controlling TFT as the TFT of the pixel portion are illustrated in FIGS. 8A and 8B. Note that the reference numerals used here correspond to those of FIG. 2.

In the current controlling TFT shown in FIG. 8A, the LDD region 33 is provided between the drain region 32 and the channel forming region 34. The structure of the current controlling TFT shown here has a region where the LDD region 33 overlaps with the gate electrode 35 through the gate insulating film 18 sandwiched therebetween and a region where the LDD region 33 does not overlap with the gate electrode 35. However, as shown in FIG. 8B, the LDD region 33 need not be provided in the structure thereof.

The current controlling TFT supplies a current for making the EL element to emit light, and at the same time controls the supply amount to enable gradation display. Thus, it is necessary to take a countermeasure against deterioration due to the hot carrier injection so that deterioration does not occur even when a current is supplied.

Against deterioration caused by the hot carrier injection, it is known that a structure in which the LDD region overlaps with the gate electrode is very effective. Therefore, although the structure in which the LDD region is provided overlapping with the gate electrode 35 through the gate insulating film 18 sandwiched therebetween as shown in FIG. 8A is appropriate, as a countermeasure against the OFF current value, the LDD region provided so as not to overlap with the gate electrode is shown in the structure here. However, an LDD region not overlapping the gate electrode does not have to be necessarily provided. In addition, the LDD regions do not have to be provided in the structure as shown in FIG. 8B depending on the situation.

In the structures of the TFT shown in FIGS. 8A and 8B, when a voltage $V_{DS}$ that is applied to the TFT is 10 V or more, then the structure shown in FIG. 8A is preferable. On the other hand, when the voltage $V_{DS}$ that is applied to the TFT is less than 10 V, then the structure shown in FIG. 8B is preferable.

Note that, after forming the cover layer 354 as shown in FIG. 6C and enhancing the airtightness, a connecter (flexible printed circuit: FPC) for connecting the element formed on the insulating body or a terminal led out from the circuit to an external signal terminal is attached, whereby the self-light emitting device is completed as a product. In the present specification, the product completed to such a state to be shipped is called the self-light emitting device (or an EL module).

Figure 9A:
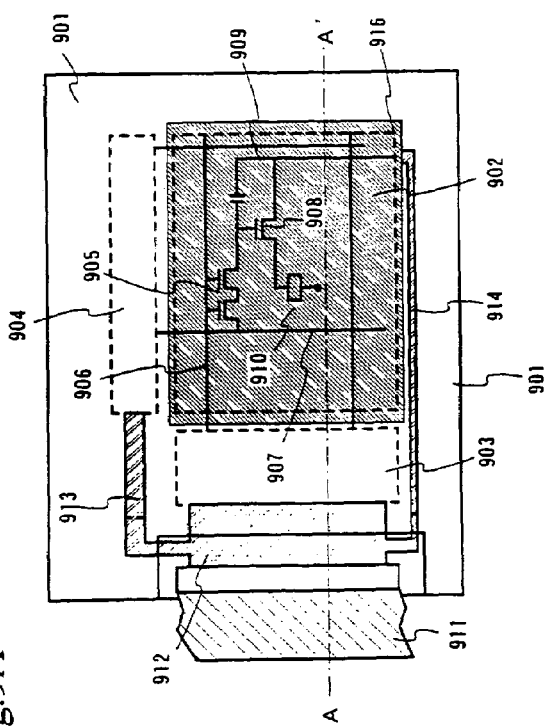
FIGS. 9A and 9B are views showing the outer appearance of a self-light emitting device.
Figure 9B:
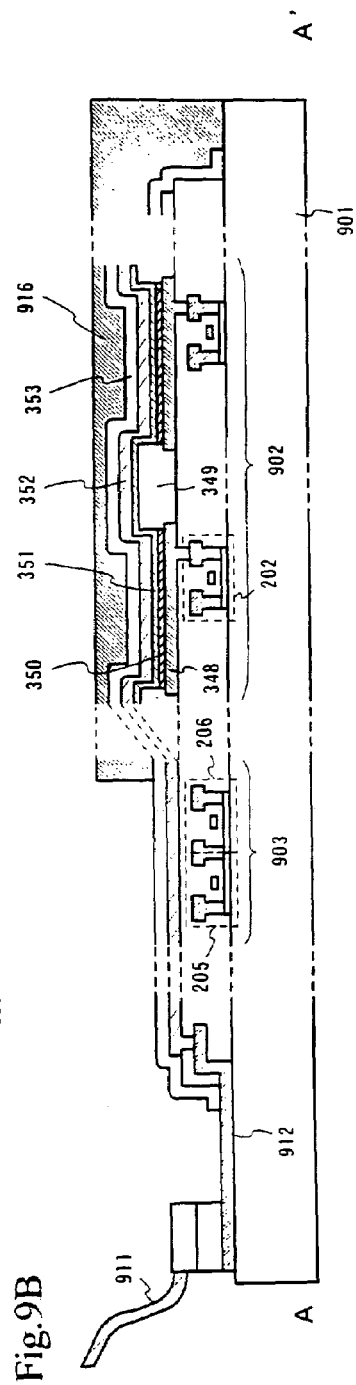

The EL module of Embodiment 2 that has been formed up to the cover layer is explained here with reference to FIGS. 9A and 9B.

The active matrix type self-light emitting device of Embodiment 2 includes a pixel portion 902, a gate side driver circuit 903, and a source side driver circuit 904 formed on a glass substrate 901. A switching TFT 905 of the pixel portion is an N channel TFT and is disposed at an intersection of a gate wiring line 906 that is connected to the gate side driver circuit 903 and a source wiring line 907 that is connected to the source side driver circuit 904. Further, a drain of the switching TFT 905 is connected to a gate of a current controlling TFT 908.

Further, a source side of the current controlling TFT 908 is connected to a power source supply line 909. In the structure such as Embodiment 2, a ground electric potential (earth electric potential) is imparted to the power source supply line 909. An EL element 910 is connected to the drain of the current controlling TFT 908. Further, a predetermined voltage (3 to 12 V, preferably 3 to 5 V) is applied to the anode of the EL element 910.

Connecting wirings 912 and 913 for transmitting signals to the driver circuit portions and a connecting wiring line 914 connected to the power source supply line 909 are provided in an FPC 911 serving as an external input/output terminal.

Here, shown in FIG. 9B is a sectional view corresponding to the cross-section taken along the line A–A' of FIG. 9A. Note that, in FIGS. 9A and 9B, the same reference numerals are used to denote the same components, and in a portion thereof, the same reference numerals are used to denote the same components of FIG. 6.

As shown in FIG. 9B, the pixel portion 902 and the gate side driver circuit 903 are formed on the glass substrate 901. The pixel portion 902 is composed of a plurality of pixels each including the current controlling TFT 202 and the pixel electrode 348 that is electrically connected to the current controlling TFT 202. The gate side driver circuit 903 is formed using a CMOS circuit in which the N channel TFT 205 and the P channel TFT 206 are combined complementarity.

The pixel electrode 348 functions as an anode of the EL element. The bank 349 is formed in the gap of the pixel electrode 348 to thereby form the EL layer 350 on the inner side of the bank 349. The cathode 351 and the protective electrode 352 are further formed thereon. It is to be noted that the structure of the EL element is not necessarily limited to the structure shown in Embodiment 2, but the structure of the EL element may be inverted and the pixel electrode may function as the cathode.

In the case of Embodiment 2, the protective electrode 352 also functions as a common wiring shared by all pixel rows, and is electrically connected to the FPC 911 via the connecting wiring 912. All of the elements contained in the pixel portion 902 and in the gate side driver circuit 903 are covered with the barrier layer that is made of an inorganic material such as silicon nitride, tantalum oxide, or carbon (specifically a DLC film). Although it is possible to omit the barrier layer 353, the provision of the barrier layer 353 is preferred in terms of shielding the respective elements from the outside.

Next, a cover layer 916 is provided on the barrier layer so as to cover the EL element. As the cover layer 916, PVC (polyvinyl chloride), epoxy resin, silicone resin, acrylic resin, PVB (polyvinyl butylal), or EVA (ethylenevinyl acetate) may be used. An absorbent (not shown) placed inside the cover layer 916 keeps moisture absorbing effect, which is preferable.

A protecting substrate that is made of glass, plastic, and ceramic can be provided on the cover layer 916. In addition, the structure may be one in which the protecting substrate (not shown in the figure) is bonded to the active matrix substrate by using the cover layer 916.

By providing the barrier layer 353 and the cover layer 916 on the EL element 910 using the method as described above, the EL element 910 may be completely cut off from the external environment and the invasion from the outside by substances that accelerate the oxidation degradation of the EL layer, such as moisture and oxygen, can thus be prevented. Accordingly, a self-light emitting device with high reliability can be manufactured.

Figure 10:
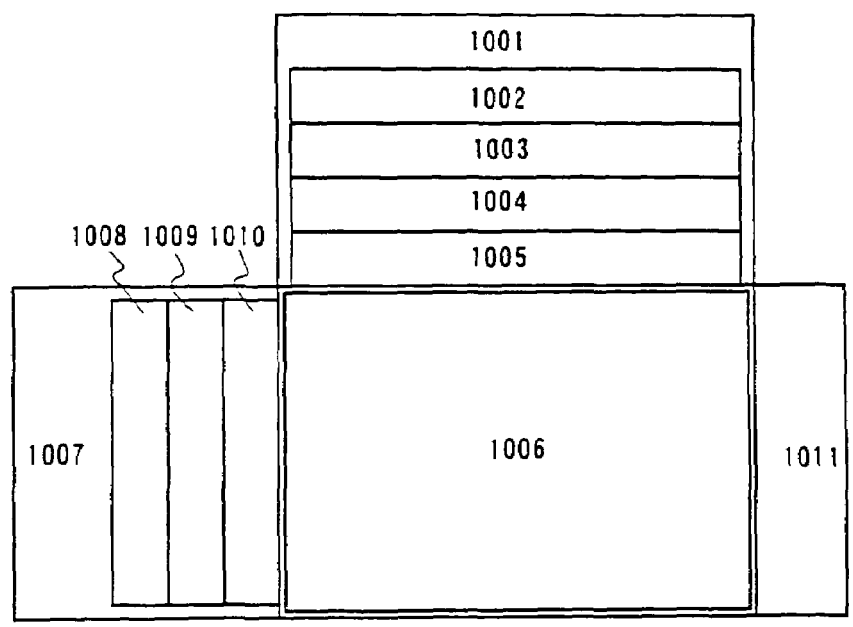
FIG. 10 is a diagram illustrating a circuit block configuration of a self-light emitting device.

An example of a circuit configuration of the self-light emitting device shown in FIG. 9 is illustrated in FIG. 10. The self-light emitting device of Embodiment 2 includes a source side driver circuit 1001, a gate side driver circuit (A) 1007, a gate side driver circuit (B) 1011, and a pixel portion 1006. Note that, in the present specification, the term "driver circuit portion" is a generic term including the source side processing circuit and the gate side driver circuit.

The source side driver circuit 1001 is provided with a shift register 1002, a level shifter 1003, a buffer 1004, and a sampling circuit (sample and hold circuit) 1005. Further, the gate side driver circuit (A) 1007 is provided with a shift register 1008, a level shifter 1009, and a buffer 1010. The gate side driver circuit (B) 1011 also takes the same structure.

Here, the shift registers 1002 and 1008 have driving voltages of 5 to 16 V (typically 10 V), respectively, and the structure indicated by the reference numeral 205 in FIG. 6C is suitable for the N channel TFT that is used in a CMOS circuit for forming the circuits.

Besides, the CMOS circuit including the N channel TFT 205 in FIG. 6C is suitable for each of the level shifters 1003 and 1009 and the buffers 1004 and 1010, similarly to the shift register. Incidentally, the gate wiring with multi-gate structure such as a double gate structure or a triple gate structure is effective in improving the reliability of each circuit. The pixel with the structure illustrated in FIG. 2 is arranged in the pixel portion 1006.

The foregoing structure can be easily realized by manufacturing TFTs in accordance with the manufacturing steps shown in FIGS. 4A to 6C. In Embodiment 2, although only the structure of the pixel portion and the driver circuit portion is shown, it is possible to form not only the driver circuit, but also a logical circuit such as a signal dividing circuit, a D/A converter circuit, an operational amplifier circuit, a ā-correction circuit on the same insulating body if the manufacturing steps of the circuits are carried out in accordance with those of Embodiment 2. In addition, it is believed that a memory portion, a microprocessor, or the like can be formed.

The constitution of Embodiment 2 can be freely combined with the constitution of Embodiment 1.

Embodiment 3

Figure 11:
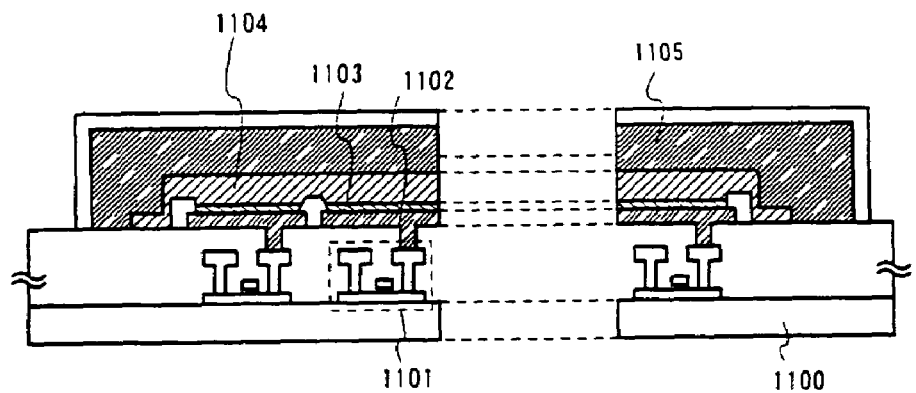
FIG. 11 is a diagram showing a cross-sectional structure of an active matrix type self-light emitting device.

A method of manufacturing a lamination structure that is different from the one shown in FIG. 1B will be explained in Embodiment 3. In FIG. 11, a current controlling TFT 1101 is formed on a substrate 1100, and a pixel electrode 1102 electrically connected to the current controlling TFT 1101 is formed as illustrated in the drawing. In Embodiment 3, an EL layer 1103 is formed on the pixel electrode 1102 using the ink jet method. Note that it is appropriate to use the same material used in Embodiment 1 for the application liquid for the EL layer.

Provided on the EL layer 1103 is a cathode 1104 formed using the evaporation method. Note that it is appropriate to use a material that has a small work function, such as MgAg and Al—Li, for forming the cathode 1104. After forming the cathode 1104, the ink jet method is again used to form a cover layer 1105 made of an organic resin film evenly on the pixel portion. Preferably, the film thickness of the cover layer 1105 formed is between 10 nm and 300 nm.

As a material for forming the cover layer 1105 made of an organic resin, it is appropriate to use a material that has a high degree of hardness, is unlikely to allows substances such as moisture and oxygen to permeate, and has planarity. To be more specific, organic resins such as epoxy resin, acrylic resin, polyimide, polyamide, and silicon resin are preferable. Because the cover layer 1105 is formed using the ink jet method, it can be selectively formed on the pixel portion.

Figure 12:
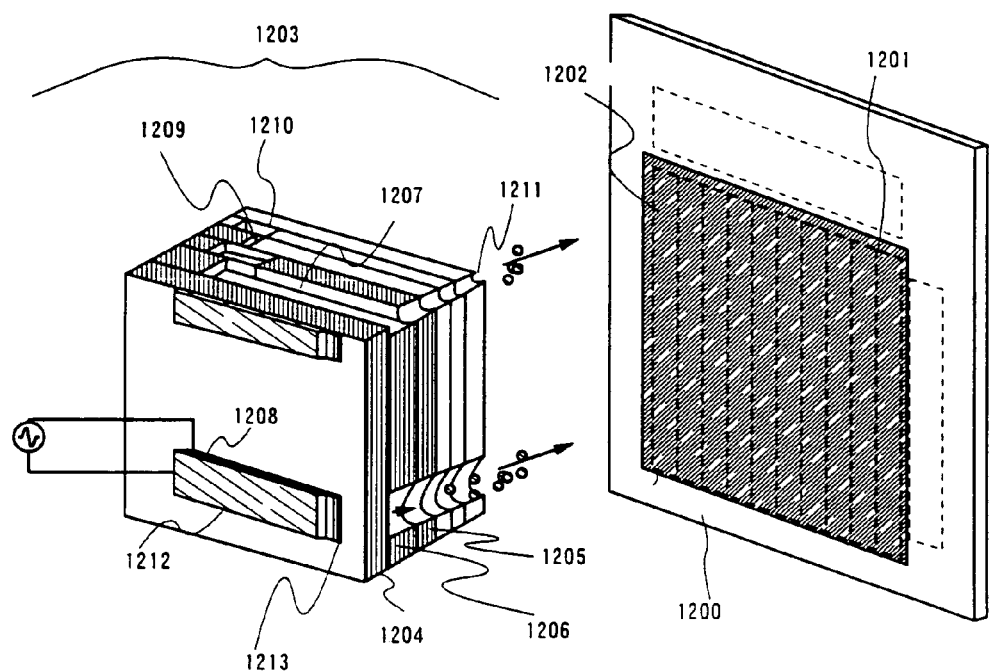
FIG. 12 is a diagram showing a thin film formation method.

Shown in FIG. 12 is the method of forming a cover layer 1202 on a pixel portion 1201 on an active matrix substrate 1200 by using the ink jet method. Note that, the application liquid for forming the EL layer and the organic resin liquid for forming the cover layer are discharged from a head 1203 in the structure shown here. Note that in the Piezo method known for the ink jet method, there are types, one being the MLP (Multi Layer Piezo) type and the other being the MLChip (Multi Layer Ceramic Hyper Integrated Piezo Segments) type. The head 1203 shown here is one called On Demand Piezo Driver MLChip method that is manufactured by Seiko-Epson Corp.

The MLChip is an actuator composed of an oscillation plate 1204 made of ceramic, a communicating plate 1205, and a material chamber plate 1206 that forms the material chamber 1207, and piezo elements 1208 are formed on the vibrator plate 1204 in correspondence with each of the material chambers.

Then, in the MLChip, three stainless plates (SUS plate) are laminated to form a supply hole 1209, a reserver 1210, and a nozzle 1211 which thereby form a head 1203. It is to be noted FIG. 12 shows a state where two nozzles 1211 are provided. However, the number of nozzles is not limited thereto, but one nozzle may be provided or three or more may be provided depending on the region to be applied and the application liquid.

The operating principle of the application device fabricated from this MLChip is that when a voltage is applied to a top electrode 1212 and a bottom electrode 1213, the piezo elements 1208 vibrate to thereby cause a piezoelectric effect of the piezo elements 1208 and the vibrator plate 1204, that is, a bending vibration. In other words, pressure is applied to the material chamber 1207 by this bending vibration, whereby the organic resin liquid provided in the material chamber 1207 is pushed out and then applied.

As shown in FIG. 11, after the formation of the cover layer 1105, a barrier layer 1106 is formed by sputtering to cover the cover layer 1105. In Embodiment 3, the barrier layer 1106 is formed of a carbon film, specifically a DLC (Diamond Like Carbon) film. However, the material for forming the barrier layer 1106 is not necessarily limited thereto, but materials such as tantalum oxide, aluminum nitride, or silicon nitride may also be used. It is note that the barrier layer 1106 is formed selectively using a shadow mask.

Thus, by forming the cover layer 1105 and the barrier layer 1106 on the active matrix substrate, the invasion of degrading factors to the EL element, such as moisture and oxygen, from the outside can be prevented.

Embodiment 4

Figure 13:
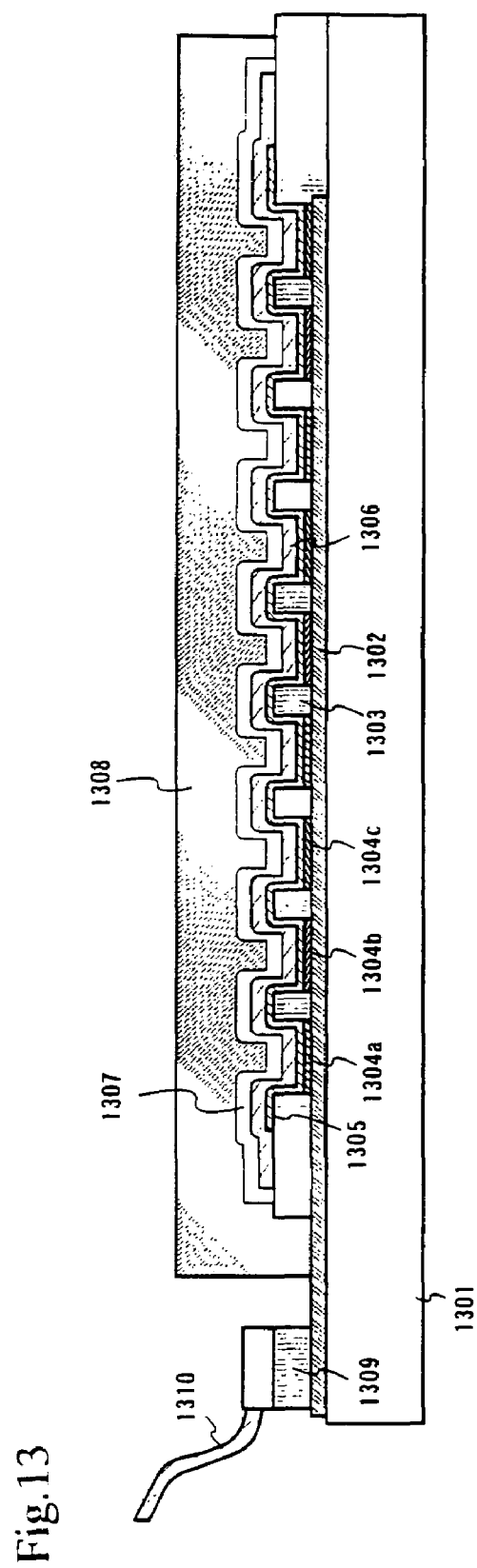
FIG. 13 is a diagram showing a cross-sectional structure of a passive type self-light emitting device.

A case of employing the present invention in a passive type (simple matrix type) self-light emitting device is explained in Embodiment 4 with reference to FIG. 13. In FIG. 13, reference numeral 1301 denotes a substrate made of plastic and 1302 denotes an anode made of a transparent conductive film. A compound of indium oxide and zinc oxide is formed by sputtering as the anode 1302 in Embodiment 4. Note that, although not shown in FIG. 13, a plural number of lines of anodes 1302 are arranged in stripe shapes in a parallel direction with the defined space.

Further, cathodes 1306 arranged in stripe shapes are formed in a perpendicular direction on the defined space. Banks 1303 are formed so as to fill up the spaces between the cathodes 1306.

Subsequently, EL layers 1304a to 1304c made of an EL material are formed by using the electric field application method described in Embodiment 1. Note that, reference numeral 1304a denotes an EL layer luminescing a red color, 1304b denotes an EL layer luminescing a green color, and 1304c denotes an EL layer luminescing a blue color. An EL material used in Embodiment 1 may be used similarly in Embodiment 4. Since these EL layers are formed along the grooves which are formed by the banks 1303, these layers are arranged in stripe shapes in a perpendicular direction on the defined space.

By implementing the present embodiment, pixels of three colors, red, green, and blue, are formed on the substrate in stripe shapes. It should be noted that the pixels need not to have three colors, but may have one or two colors. In addition, the colors are not limited to red, green, and blue, but other colors such as yellow, orange and gray may be used.

First, the application liquid for forming a red color EL layer is prepared in the material chamber. The application liquid is then extracted by an electric field generated by an electrode provided on the exterior of the material chamber. The extracted application liquid for the EL layer is controlled by electric field, whereby it reaches the desired pixel portion. The EL layer is thus formed.

The application liquid for the red color EL layer is first applied. Because the application liquid is controlled by the electric field, the application liquid for the EL layer can be selectively applied onto the desired position of the pixel portion. Note that it is appropriate to apply the application liquid while moving the nozzle in the direction of forming one row of pixels.

Subsequently, after moving the nozzle to the adjacent row of pixels so that an application can be performed, the application liquid for the green color EL layer is applied. After further moving the nozzle to the next adjacent row of pixels, the application liquid for the blue color EL layer is applied to thereby form stripe shape EL layers of red, green, and blue in the pixel portion.

By repeating the above operation, stripe shape pixels can be formed in the pixel portion as shown in FIG. 13. Note that light emitting layers luminescing the same color may be formed one at a time or all at the same time.

Although the EL layer here denotes an EL layer of a single structure composed of only the light emitting layer, other layers formed from an organic EL material that contributes to the emission of light, such as an electric charge injection layer and an electric charge transporting layer, may also be used. There are cases where a single layer of the light emitting layer is adopted. However, for example, in the case of adopting a lamination layer composed of the hole injection layer and the light emitting layer, the lamination film is referred as an EL layer.

At this point, it is preferable that a mutual distance (D) of adjacent pixels of the same color in a line is set to 5 times or more (preferably 10 times or more) higher than the film thickness (t) of the EL layer. This is because a problem of cross-talk will occur between the pixels if D<5t. It should be noted if the distance (D) is too far apart from each other, then highly fine images can not be attained. Therefore, setting the distance (D) to 5t<D<50t (preferably 10t<D<35t) is preferable.

Further, it is possible to form the bank in a stripe shape in the horizontal direction to thereby form the EL layer luminescing a red color, the EL layer luminescing a green color, and the EL layer luminescing a blue color in the horizontal direction. At this point, the bank is formed above the gate wiring through the insulating film and along the gate wiring.

In this case, similarly, it is appropriate to set the mutual distance (D) of adjacent pixels of the same color in a line to 5 times or more (preferably 10 times or more) higher than the film thickness (t) of the EL layer, and more preferably to 5t<D<50t (preferably 10t<D<35t).

Thus, the application liquid for the EL layer is controlled by an electric field to thereby form the EL layer, resulting in making it possible to control the application position.

Thereafter, although not shown in FIG. 13, the cathodes and protective electrodes are arranged in stripe shapes so as to be orthogonal to the anodes 1302 and so that the perpendicular direction of a plural number of lines of cathodes and protective electrodes on the defined space become the longitudinal direction. Note that the cathode 1305 is made from MgAg and the protective electrode 1306 is made from an aluminum alloy film, and the both are respectively formed by evaporation in Embodiment 4. Furthermore, a wiring, not shown in the drawing, is drawn to a portion where an FPC will be attached later so that a predetermined voltage can be applied to the protective electrode 1306.

An EL element is thus formed on the substrate 1301. Note that since a lower side electrode serves as a transmissive anode in Embodiment 4, light generated by the EL layers 1304a to 1304c is irradiated to a lower surface (substrate 1301). However, the lower side electrode can serve as a light shielding cathode by reversing the structure of the EL element. In that case, light generated by the EL layers 1304a to 1304c is irradiated to an upper surface (the side opposite the substrate 1301).

After the formation of the protective electrode 1306, a barrier layer 1307 made of an inorganic material is formed.

It is appropriate here to use inorganic materials such as silicon nitride, tantalum oxide, aluminum nitride, or carbon (specifically a DLC film). The barrier layer can be formed by plasma CVD, sputtering, or evaporation. A silicon nitride film is formed by sputtering as the barrier layer 1307 in Embodiment 4. At this point, a preferable film thickness of the barrier layer 1307 is between 10 nm and 100 nm.

A cover layer 1308 made of an organic resin film is subsequently formed by the same method used for forming the EL layer. Note that it is appropriate to use materials such as polyamide and polyimide as the organic resin used here. Further, barium oxide may be doped into the organic resin film as an absorbent (not shown in the figure). Finally, an FPC 1310 is attached via an anisotropic conductive film 1309, thereby completing the passive type self-light emitting device.

Figure 14:
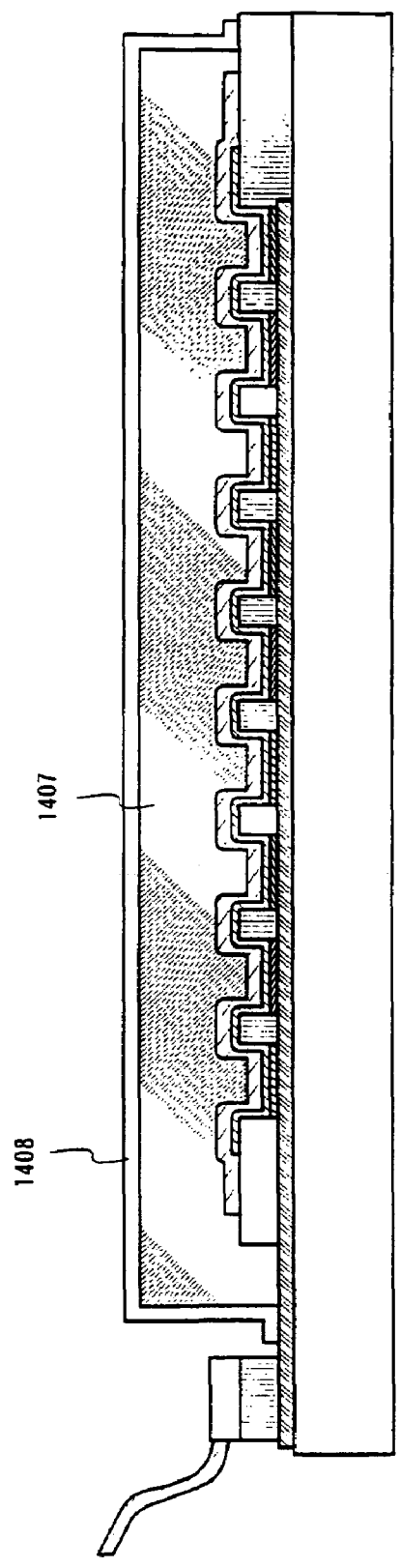
FIG. 14 is a diagram showing a cross-sectional structure of a passive type self-light emitting device.

The passive type self-light emitting device shown in FIG. 13 has a structure in which the barrier layer 1307 is formed on the EL element over the substrate, and the cover layer 1308 is formed on the barrier 1307. However, as shown in FIG. 14, the structure in which a barrier layer 1408 is formed after forming a cover layer 1407 may be adopted.

It is to be noted that the constitution of Embodiment 4 may be implemented freely combining with any one of the constitutions of Embodiments 1 to 3.

Embodiment 5

In the present invention, it is effective to use a DLC (Diamond Like Carbon) film made of carbon as the barrier layer. However, if the film thickness thereof is too thick, transmissivity will drop, and therefore it is preferable to form the film thickness thereof to 50 nm or less (preferably between 10 and 20 nm).

A characteristic of the DLC film is that it has a Raman spectrum distribution with a asymmetric peak of about 1550 $cm^{-1}$ and a shoulder of about 1300 $cm^{-1}$. In addition, the DLC film shows a hardness of 15 to 25 Gpa when measured using a microhardness meter and has a characteristic that it is superior to chemical resistance. Therefore, it is effective to form such DLC film on the EL element or on the cover layer on the EL element. In any case, appropriately, the DLC film may be formed by using methods such as sputtering, ECR plasma CVD, high frequency plasma CVD, or ion beam evaporation.

It is to be noted that the constitution of Embodiment 5 may be implemented freely combining with any one of the constitutions of Embodiments 1 to 4.

Embodiment 6

When the present invention is implemented to manufacture an active matrix self-light emitting display device, it is effective to use a silicon substrate (silicon wafer) as a substrate. In the case of using the silicon substrate as the substrate, a manufacturing technique of MOSFET utilized in the conventional IC, LSI or the like can be employed to manufacture a switching element and a current control element to be formed in the pixel portion, or a driver element to be formed in the driver circuit portion.

The MOSFET can form circuits having extremely small variations as achievements in the IC and the LSI. Particularly, it is effective for the active matrix EL display device with an analog driver of performing gradation display by an electric current value.

It is to be noted that the silicon substrate is not transmissive, and therefore the structure needs to be constructed so that light from the EL layer is irradiated to a side opposite the substrate. The structure of the EL display device of Embodiment 5 is similar to that of FIG. 9. However, the difference is that the MOSFET is used for forming a pixel portion 902 and a driver circuit portion 903 instead of a TFT.

Note that it is possible to implement the structure of Embodiment 5 freely combining it with the structure of any of Embodiments 1 to 5.

Embodiment 7

The self-emission device fabricated in accordance with the present invention is of the self-emission type, and thus exhibits more excellent recognizability of the displayed image in a light place as compared to the liquid crystal display device. Furthermore, the self-emission device has a wider viewing angle. Accordingly, the self-emission device can be applied to a display portion in various electronic devices. For example, in order to view a TV program or the like on a large-sized screen, the EL display device in accordance with the present invention can be used as a display portion of an EL display (i.e., a display in which a self-emission device is installed into a frame) having a diagonal size of 30 inches or larger (typically 40 inches or larger.)

The EL display includes all kinds of displays to be used for displaying information, such as a display for a personal computer, a display for receiving a TV broadcasting program, a display for advertisement display. Moreover, the self-emission device in accordance with the present invention can be used as a display portion of other various electric devices.

Such electronic devices include a video camera, a digital camera, a goggles-type display (head mount display), a navigation system, a sound reproduction device (a car audio equipment and an audio set), note-size personal computer, a game machine, a portable information terminal (a mobile computer, a portable telephone, a portable game machine, an electronic book, or the like), an image reproduction apparatus including a recording medium (more specifically, an apparatus which can reproduce a recording medium such as a digital video disc (DVD) and so forth, and includes a display for displaying the reproduced image), or the like. In particular, in the case of the portable information terminal, use of the self-emission device is preferable, since the portable information terminal that is likely to be viewed from a tilted direction is often required to have a wide viewing angle. FIGS. 15A to 16B respectively show various specific examples of such electronic devices.

Figure 15A:
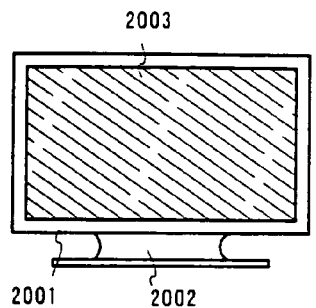
FIGS. 15A to 15F are views showing concrete examples of electric appliances.

FIG. 15A illustrates an EL display which includes a frame 2001, a support table 2002, a display portion 2003, or the like. The present invention is applicable to the display portion 2003. The EL display is of the self-emission type and therefore requires no back light. Thus, the display portion thereof can have a thickness thinner than that of the liquid crystal display device.

Figure 15B:
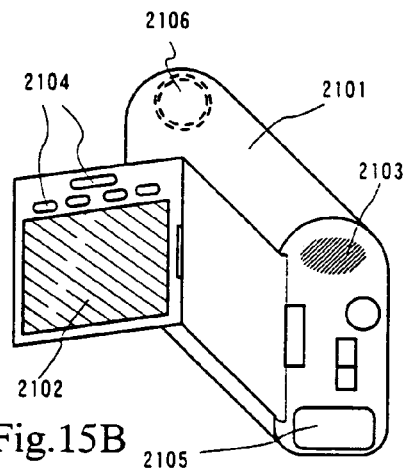

FIG. 15B illustrates a video camera which includes a main body 2101, a display portion 2102, an audio input portion 2103, operation switches 2104, a battery 2105, an image receiving portion 2106, or the like. The self-emission device in accordance with the present invention can be used as the display portion 2102.

Figure 15C:
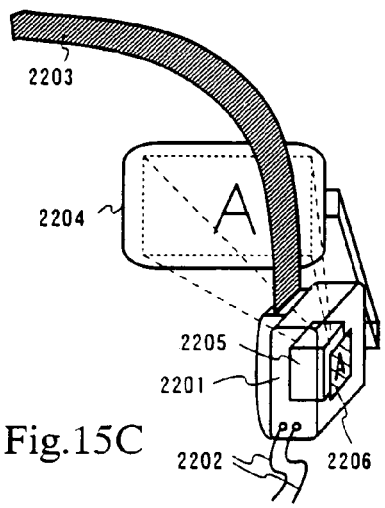

FIG. 15C illustrates a portion (the right-half piece) of an EL display of head mount type, which includes a main body 2201, signal cables 2202, a head mount band 2203, a display portion 2204, an optical system 2205, a self-emission device 2206, or the like. The present invention is applicable to the self-emission device 2206.

Figure 15D:
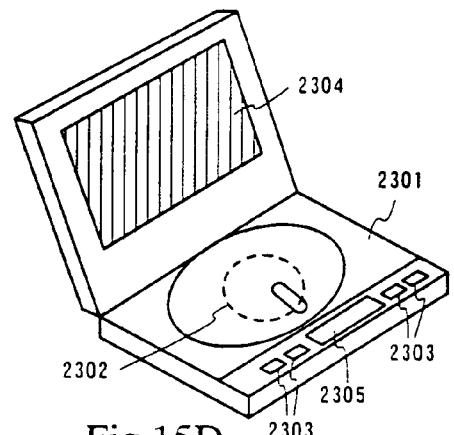

FIG. 15D illustrates an image reproduction apparatus including a recording medium (more specifically, a DVD reproduction apparatus), which includes a main body 2301, a recording medium (a DVD or the like) 2302, operation switches 2303, a display portion (a) 2304, another display portion (b) 2305, or the like. The display portion (a) is used mainly for displaying image information, while the display portion (b) is used mainly for displaying character information. The self-emission device in accordance with the present invention can be used as these display portions (a) and (b). The image reproduction apparatus including a recording medium further includes a game machine or the like.

Figure 15E:
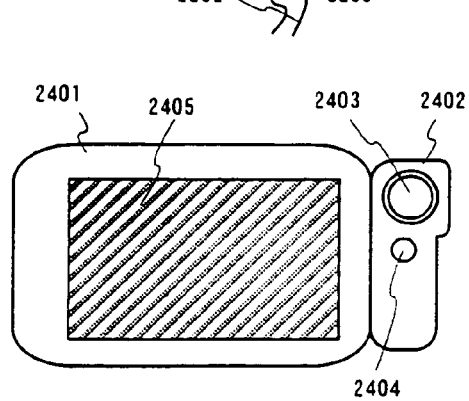

FIG. 15E illustrates a portable (mobile) computer which includes a main body 2401, a camera portion 2402, an image receiving portion 2403, operation switches 2404, a display portion 2405, or the like. The self-emission device in accordance with the present invention can be used as the display portion 2405.

Figure 15F:
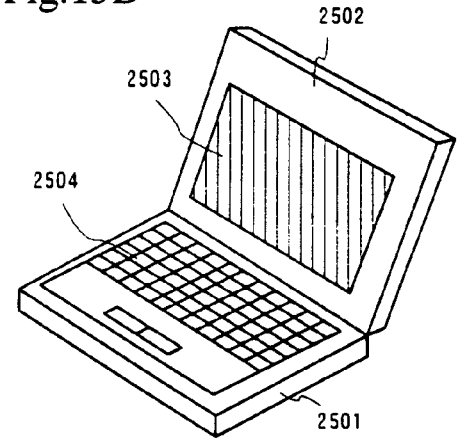

FIG. 15F illustrates a personal computer which includes a main body 2501, a frame 2502, a display portion 2503, a key board 2504, or the like. The self-emission device in accordance with the present invention can be used as the display portion 2503.

When the brighter luminance of light emitted from the organic EL material becomes available in the future, the self-emission device in accordance with the present invention will be applicable to a front-type or rear-type projector in which light including output image information is enlarged by means of lenses or the like to be projected.

The forementioned electronic devices are more likely to be used for display information distributed through a telecommunication path such as Internet, a CATS (cable television system), and in particular likely to display moving picture information. The self-emission device is suitable for displaying moving pictures since the organic EL material can exhibit high response speed. However, if the contour between the pixels becomes unclear, the moving pictures as a whole cannot be clearly displayed. Since the self-emission device in accordance with the present invention can make the contour between the pixels clear, it is significantly advantageous to apply the self-emission device of the present invention to a display portion of the electronic devices.

A portion of the self-emission device that is emitting light consumes power, so it is desirable to display information in such a manner that the light emitting portion therein becomes as small as possible. Accordingly, when the self-emission device is applied to a display portion which mainly displays character information, e.g., a display portion of a portable information terminal, and more particular, a portable telephone or a sound reproduction device, it is desirable to drive the self-emission device so that the character information is formed by a light-emitting portion while a non-emission portion corresponds to the background.

Figure 16A:
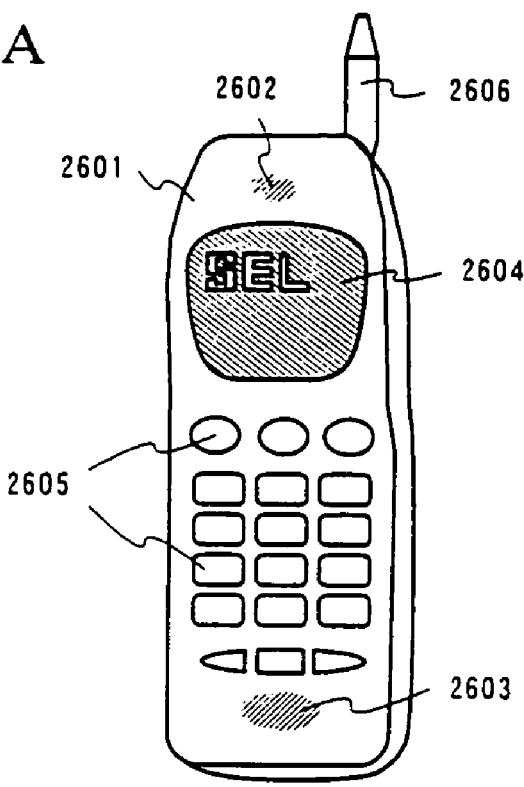
FIGS. 16A and 16B are views showing concrete examples of electric appliances.

With now reference to FIG. 16A, a portable telephone is illustrated, which includes a main body 2601, an audio output portion 2602, an audio input portion 2603, a display portion 2604, operation switches 2605, and an antenna 2606. The self-emission device in accordance with the present invention can be used as the display portion 2604. The display portion 2604 can reduce power consumption of the portable telephone by displaying white-colored characters on a black-colored background.

Figure 16B:
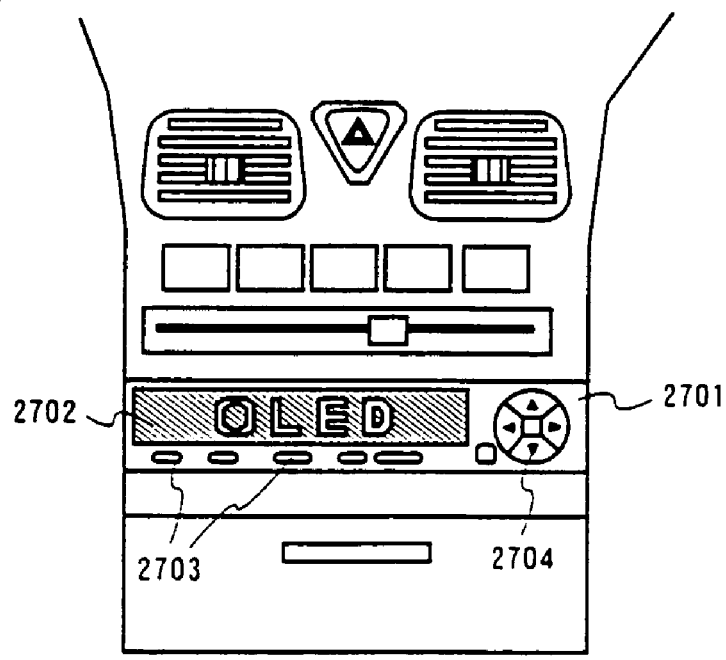

FIG. 16B illustrates a sound reproduction device, a car mounted audio equipment in concrete term, which includes a main body 2701, a display portion 2702, and operation switches 2703 and 2704. The self-emission device in accordance with the present invention can be used as the display portion 2702. Although the car audio equipment of the mount type is shown in the present embodiment, the present invention is also applicable to an audio of the portable type and the set type. The display portion 2704 can reduce power consumption by displaying white-colored characters on a black-colored background, which is particularly advantageous for the audio of the portable type.

As set forth above, the present invention can be applied variously to a wide range of electronic devices in all fields. The electronic device in the present embodiment can be obtained by utilizing a self-emission device having the configuration in which the structures in Embodiments 1 through 6 are freely combined.

Embodiment 8

In this embodiment, an external light emitting quantum efficiency can be remarkably improved by using an EL material by which phosphorescence from a triplet exciton can be employed for emitting a light. As a result, the power consumption of the EL element can be reduced, the lifetime of the EL element can be elongated and the weight of the EL element can be lightened.

The following is a report where the external light emitting quantum efficiency is improved by using the triplet exciton (T. Tsutsui, C. Adachi, S. Saito, Photochemical processes in organized molecular systems, ed. K. Honda, (Elsevier Sci. Pub., Tokyo, 1991) p. 437).

The molecular formula of an EL material (coumarin pigment) reported by the above article is represented as follows.

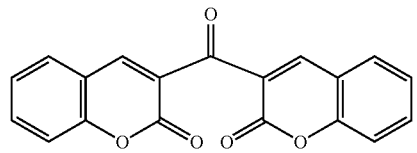

(M. A. Baldo, D. F. O'Brien, Y. You, A. Shoustikov, S. Sibley, M. E. Thompson, S. R. Forrest, Nature 395(1998) p. 151)

The molecular formula of an EL material (Pt complex) reported by the above article is represented as follows.

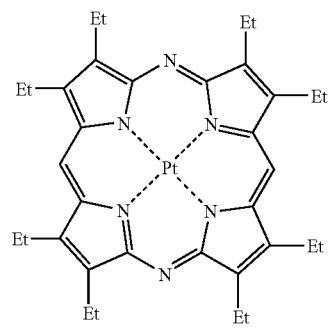

(M. A. Baldo, S. Lamansky, P. E. Burrows, M. E. Thompson, S. R. Forrest, Appl. Phys. Lett., 75 (1999) p.4.)

(T. Tsutsui, M. -J. Yang, M. Yahiro, K. Nakamura, T. Watanabe, T. Tsuji. Y. Fukuda, T. Wakimoto, S. Mayaguchi, Jpn, Appl. Phys., 38 (12B) (1999) L1502)

The molecular formula of an EL material (Ir complex) reported by the above article is represented as follows.

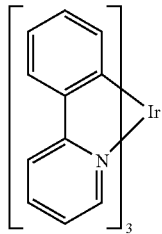

As described above, if phosphorescence from a triplet exciton can be used, it can be realized that the external light emitting quantum efficiency is three to fourth times as high as that in the case of using fluorescence from a singlet exciton in principle.

The structure according to Embodiment 8 can be freely implemented in combination wiyh any structures of the Embodiments 1 to 7.

By implementing the present invention, the EL layer and the cover layer can be formed by using the same application method and t is possible to effectively form the EL layer, the cathode, the barrier layer, and the cover layer in the same multi-chamber in succession without releasing them to the atmosphere. In addition, by forming the barrier layer and the cover layer, the permeation of moisture and oxygen into the EL layer is prevented. Thus, it is an effective against degradation of the EL layer. Further, forming the barrier layer and the cover layer complete the sealing structure, and hence compared with a normal sealing structure, it becomes possible to make the sealing structure of the present invention more smaller and lighter in weight.

What is claimed is:

1. A method of manufacturing a light emitting device comprising:
   forming an EL element comprising a first electrode, a light emitting layer over the first electrode, and a second electrode over the light emitting layer;
   forming a film comprising an inorganic material covering the EL element; and
   forming a film comprising an organic material covering the film comprising said inorganic material,
   wherein the light emitting layer and said film comprising an organic material are formed by an ink jet method, and
   wherein the light emitting layer comprises a low molecular material.

2. A method of manufacturing a light emitting device according to claim 1, wherein the film comprising an inorganic material comprises one of silicon nitride, tantalum oxide, aluminum nitride, or carbon.

3. A method of manufacturing a light emitting device according to claim 1, wherein the film comprising an organic material comprises one of polyamide, polyimide, acrylic resin, or benzocyclobuten.

4. A method of manufacturing a light emitting device according to claim 1, wherein the light emitting device is incorporated into an electronic appliance selected from the group consisting of a video camera, a head mount type display, an image reproduction apparatus, a portable computer, a personal computer, a portable telephone, and a sound reproduction device.

5. A method of manufacturing a light emitting device comprising:
   forming an EL element comprising a first electrode, a light emitting layer over the first electrode, and a second electrode over the light emitting layer;
   forming a film comprising an inorganic material covering the EL element; and
   forming a film comprising an organic material covering the film comprising said inorganic material,
   wherein the light emitting layer and said film comprising an organic material are formed by an electric field application method, and
   wherein the light emitting layer comprises a low molecular material.

6. A method of manufacturing a light emitting device according to claim 5, wherein the film comprising an inorganic material comprises one of silicon nitride, tantalum oxide, aluminum nitride, or carbon.

7. A method of manufacturing a light emitting device according to claim 5, wherein the film comprising an organic material comprises one of polyamide, polyimide, acrylic resin, or benzocyclobuten.

8. A method of manufacturing a light emitting device according to claim 5, wherein the light emitting device is incorporated into an electronic appliance selected from the group consisting of a video camera, a head mount type display, an image reproduction apparatus, a portable computer, a personal computer, a portable telephone, and a sound reproduction device.

9. A method of manufacturing a light emitting device comprising:
   forming an EL element comprising a first electrode, a light emitting layer over the first electrode, and a second electrode over the light emitting layer;
   forming a film comprising an inorganic material covering the EL element; and
   forming a film comprising an organic material covering the film comprising said inorganic material,
   wherein the light emitting layer and said film comprising an organic material are formed by a same method,
   wherein the light emitting layer comprises a low molecular material, and
   wherein the light emitting layer, the second electrode, the film comprising an inorganic material, and the film comprising an organic material are formed continuously using the same film deposition apparatus.

10. A method of manufacturing a light emitting device according to claim 9, wherein the film comprising an inorganic material comprises one of silicon nitride, tantalum oxide, aluminum nitride, or carbon.

11. A method of manufacturing a light emitting device according to claim 9, wherein the film comprising an organic material comprises one of polyamide, polyimide, acrylic resin, or benxocyclobuten.

12. A method of manufacturing a light emitting device according to claim 9, wherein the light emitting device is incorporated into an electronic appliance selected from the group consisting of a video camera, a head mount type display, an image reproduction apparatus, a portable computer, a personal computer, a portable telephone, and a sound reproduction device.

13. A method of manufacturing a light emitting device comprising:

forming an EL element comprising a first electrode, a light emitting layer over the first electrode, and a second electrode over the light emitting layer;

forming a film comprising an organic material covering the EL element; and forming a film comprising an inorganic material covering the film comprising said organic material, wherein the light emitting layer and said film comprising an organic material are formed by an ink jet method, and wherein the light emitting layer comprises a low molecular material.

14. A method of manufacturing a light emitting device according to claim 13, wherein the film comprising an inorganic material comprises one of silicon nitride, tantalum oxide, aluminum nitride, or carbon.

15. A method of manufacturing a light emitting device according to claim 13, wherein the film comprising an organic material comprises one of polyamide, polyimide, acrylic resin, or benzocyclobuten.

16. A method of manufacturing a light emitting device according to claim 13, wherein the light emitting device is incorporated into an electronic appliance selected from the group consisting of a video camera, a head mount type display, an image reproduction apparatus, a portable computer, a personal computer, a portable telephone, and a sound reproduction device.

17. A method of manufacturing a light emitting device comprising:

forming an EL element comprising a first electrode, a light emitting layer over the first electrode, and a second electrode over the light emitting layer;

forming a film comprising an organic material covering the EL element; and forming a film comprising an inorganic material covering the film comprising said organic material, wherein the light emitting layer and said film comprising an organic material are formed by an electric field application method, and wherein the light emitting layer comprises a low molecular material.

18. A method of manufacturing a light emitting device according to claim 17, wherein the film comprising an inorganic material comprises one of silicon nitride, tantalum oxide, aluminum nitride, or carbon.

19. A method of manufacturing a light emitting device according to claim 17, wherein the film comprising an organic material comprises one of polyamide, polyimide, acrylic resin, or benzocyclobuten.

20. A method of manufacturing a light emitting device according to claim 17, wherein the light emitting device is incorporated into an electronic appliance selected from the group consisting of a video camera, a head mount type display, an image reproduction apparatus, a portable computer, a personal computer, a portable telephone, and a sound reproduction device.

21. A method of manufacturing a light emitting device comprising:

forming an EL element comprising a first electrode, a light emitting layer over the first electrode, and a second electrode over the light emitting layer;

forming a film comprising an organic material covering the EL element; and forming a film comprising an inorganic material covering the film comprising said organic material, wherein the light emitting layer and said film comprising an organic material are formed by a same method, wherein the light emitting layer comprises a low molecular material, and wherein the light emitting layer, the second electrode, the film comprising an inorganic material, and the film comprising an organic material are formed continuously using the same film deposition apparatus.

22. A method of manufacturing a light emitting device according to claim 21, wherein the film comprising an inorganic material comprises one of silicon nitride, tantalum oxide, aluminum nitride, or carbon.

23. A method of manufacturing a light emitting device according to claim 21, wherein the film comprising an organic material comprises one of polyamide, polyimide, acrylic resin, or benzocyclobuten.

24. A method of manufacturing a light emitting device according to claim 21, wherein the light emitting device is incorporated into an electronic appliance selected from the group consisting of a video camera, a head mount type display, an image reproduction apparatus, a portable computer, a personal computer, a portable telephone, and a sound reproduction device.

* * * * *